(12) United States Patent
Akasawa et al.

(10) Patent No.: US 10,552,258 B2
(45) Date of Patent: Feb. 4, 2020

(54) SEMICONDUCTOR DEVICE, ELECTRONIC DEVICE, AND DRIVING METHOD THEREOF

(71) Applicant: Semiconductor Energy Laboratory Co., Ltd., Atsugi-shi, Kanagawa-ken (JP)

(72) Inventors: Fumika Akasawa, Kanagawa (JP); Seiichi Yoneda, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 151 days.

(21) Appl. No.: 15/695,182

(22) Filed: Sep. 5, 2017

(65) Prior Publication Data
US 2018/0081756 A1    Mar. 22, 2018

(30) Foreign Application Priority Data

Sep. 16, 2016    (JP) .................................. 2016-181182

(51) Int. Cl.
*G06F 11/00* (2006.01)
*G06F 11/10* (2006.01)
(Continued)

(52) U.S. Cl.
CPC .... *G06F 11/1068* (2013.01); *G02F 1/133602* (2013.01); *G06F 11/1004* (2013.01); *G09G 3/3225* (2013.01); *G09G 3/3648* (2013.01); *H01L 27/3232* (2013.01); *H01L 27/3262* (2013.01); *G02F 2001/133616* (2013.01); *G02F 2001/133618* (2013.01);
(Continued)

(58) Field of Classification Search
CPC .. G06F 11/1004; G06F 11/00; G06F 11/1068; G06F 11/1076; G06F 11/167
See application file for complete search history.

(56) References Cited

U.S. PATENT DOCUMENTS 5,400,275 A * 3/1995 Abe ........................ G11C 11/22
                                                     257/E27.104
8,812,898 B1 * 8/2014 Lahon ..................... G06F 11/10
                                                     714/4.2
(Continued)

FOREIGN PATENT DOCUMENTS

JP    2009-130863 A    6/2009
JP    2013-120426 A    6/2013
(Continued)

*Primary Examiner* — Charles Ehne
(74) *Attorney, Agent, or Firm* — Fish & Richardson P.C.

(57) ABSTRACT

A semiconductor device that is less likely to be affected by a soft error is provided. The semiconductor device includes a first memory, a second memory, a processor that can be connected to the first memory and the second memory, and a selector for selectively connecting one of the first memory and the second memory to the processor. The probability of occurrence of a soft error of the first memory is higher than that of the second memory. When an error derived from a soft error is detected in the first memory, the selector connects the second memory to the processor. The semiconductor device can stably operate even when moved from an environment where a soft error is less likely to occur to an environment where a soft error is likely to occur.

14 Claims, 24 Drawing Sheets

(51) Int. Cl.

| | | |
|---|---|---|
| *G02F 1/1335* | (2006.01) | |
| *G09G 3/3225* | (2016.01) | |
| *G09G 3/36* | (2006.01) | |
| *H01L 27/32* | (2006.01) | |
| *G11C 11/16* | (2006.01) | |
| *G11C 11/41* | (2006.01) | |
| *H01L 27/12* | (2006.01) | |
| *H01L 29/786* | (2006.01) | |
| *H01L 51/00* | (2006.01) | |

(52) U.S. Cl.
CPC ...... *G02F 2201/44* (2013.01); *G02F 2203/02* (2013.01); *G09G 2330/12* (2013.01); *G09G 2380/02* (2013.01); *G11C 11/16* (2013.01); *G11C 11/41* (2013.01); *H01L 27/1225* (2013.01); *H01L 29/7869* (2013.01); *H01L 51/0097* (2013.01); *H01L 2227/323* (2013.01); *H01L 2227/326* (2013.01); *H01L 2251/5338* (2013.01)

(56) References Cited

U.S. PATENT DOCUMENTS

| | | | |
|---|---|---|---|
| 2005/0229075 A1 | 10/2005 | Berkmann et al. | |
| 2005/0268207 A1* | 12/2005 | Gallagher | G11C 11/16 714/763 |
| 2011/0083041 A1* | 4/2011 | Rohleder | G06F 11/167 714/15 |
| 2012/0113707 A1 | 5/2012 | Takemura | |
| 2013/0286757 A1 | 10/2013 | Takemura | |
| 2013/0293262 A1 | 11/2013 | Takemura | |
| 2015/0199233 A1* | 7/2015 | Pelley | G06F 11/1076 714/764 |
| 2015/0325282 A1 | 11/2015 | Kato et al. | |
| 2016/0233866 A1 | 8/2016 | Ishizu et al. | |

FOREIGN PATENT DOCUMENTS

| | | |
|---|---|---|
| JP | 2013-123181 A | 6/2013 |
| JP | 2015-201814 A | 11/2015 |
| JP | 2015-228492 A | 12/2015 |

\* cited by examiner

FIG. 15A
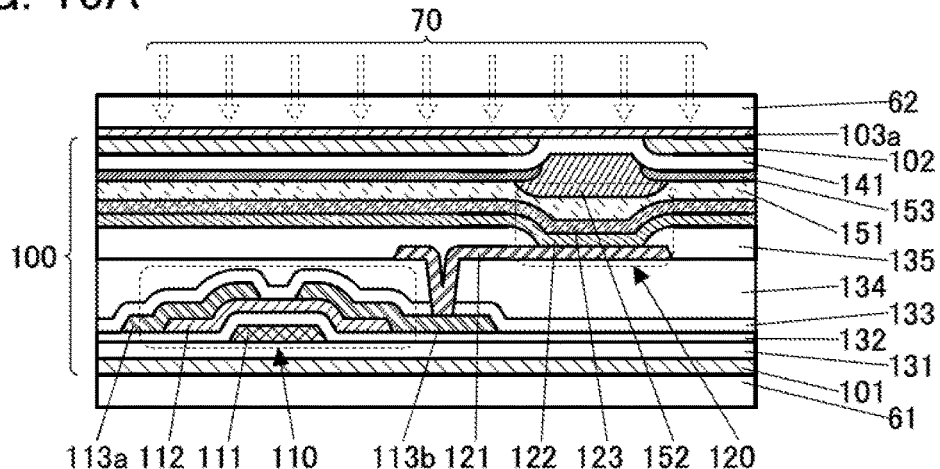
FIG. 15B1
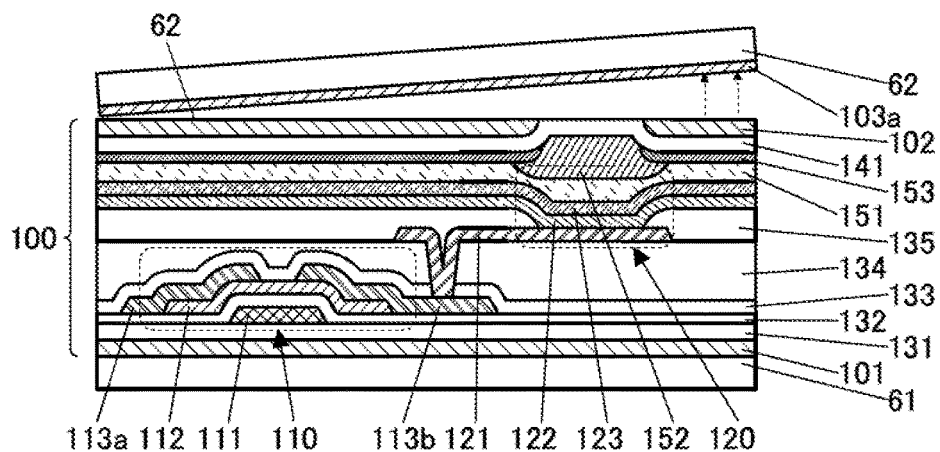
FIG. 15B2
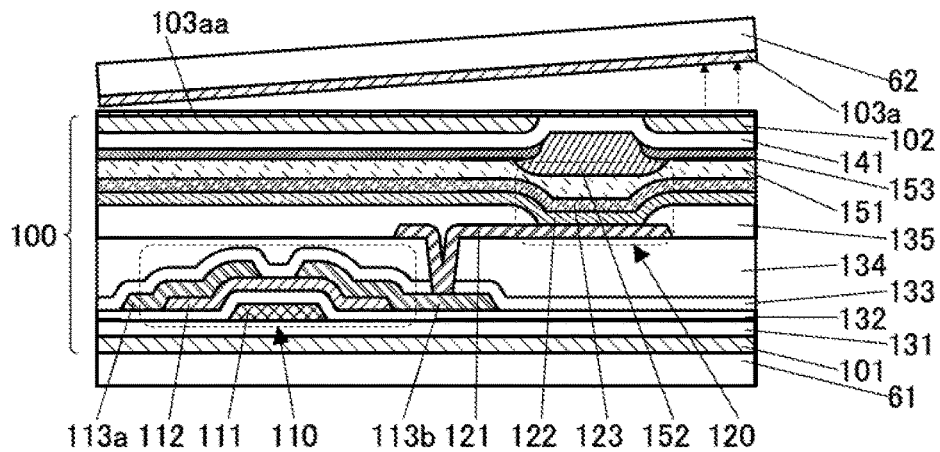

SEMICONDUCTOR DEVICE, ELECTRONIC DEVICE, AND DRIVING METHOD THEREOF

BACKGROUND OF THE INVENTION

1. Field of the Invention

The present invention relates to a semiconductor device including a memory. The present invention relates to a semiconductor device having a function of adjusting soft-error tolerance and an electronic device using the semiconductor device.

2. Description of the Related Art

As miniaturization of a semiconductor device progresses, a problem of a soft error due to radiation or the like becomes more apparent. Unlike a hard error, it is difficult to determine a cause of a soft error because data is updated and restored to a correct state by a restart or the like even after the occurrence of the soft error. As described above, a soft error that occurs in a logic circuit may cause a malfunction of a processor, a control digital circuit, or the like of a computer; therefore, a system that does not malfunction is needed.

A method using a cyclic redundancy check (CRC) is generally known as a method for detecting an error in the transfer of digital data (see Patent Document 1). However, an error cannot be sufficiently prevented even though an error can be detected. Furthermore, since a neutron ray, which is a main cause of a soft error, is difficult to block, it is difficult to deal with the soft error.

As portable electronic devices are widely used, the probability of occurrence of a soft error drastically varies. For example, the travel time from a basement of a tall building that is shielded by concrete (the amount of neutron rays is small) to a plane that flies at an ultrahigh altitude (the amount of neutron rays is large) while the electronic devices operate becomes short. Therefore, electronic devices need to be adaptive to environments.

PATENT DOCUMENT

[Patent Reference 1] United States Patent Application Publication No. 2005/0229075

SUMMARY OF THE INVENTION

An object of the present invention is to provide a highly reliable system that stably operates even when the probability of occurrence of a soft error varies by the influence of the environment or site of an electronic device.

In one embodiment of the present invention, a memory with a small technology that is capable of high-speed operation but is highly affected by a soft error and a memory with a large technology that is not capable of high-speed operation but is less likely to be affected by a soft error are prepared beforehand. An error detection circuit (a cyclic redundancy check (CRC) may be used as an inspection method, for example) detects an error. The memory with a small technology is used when no soft errors are detected (or the number of times of detection of an error is small) and the memory with a large technology can be alternatively used when a soft error is detected (or the number of times of detection of an error is large).

Note that a technology (also referred to as a technology node) is an indicator of the degree of miniaturization. In a dynamic random access memory (DRAM), for example, half of a wiring pitch of a metal wiring layer that corresponds to the lowest wiring layer (abbreviated to M1 layer that means the first layer of metal) is referred to as a "technology node" and used as an indicator of the degree of miniaturization.

In one embodiment of the present invention, a first memory that is relatively highly affected by a soft error and a second memory that is relatively less likely to be affected by a soft error are prepared beforehand. An error detection circuit (a cyclic redundancy check (CRC) may be used as an inspection method, for example) detects an error. The first memory is used when no soft errors are detected (or the number of times of detection of an error is small) and the second memory can be alternatively used when a soft error is detected (or the number of times of detection of an error is large).

For example, the first memory may be a DRAM using a silicon semiconductor and the second memory may be a memory using a transistor using a silicon semiconductor and a transistor using an oxide semiconductor (hybrid memory), which is disclosed in the specification of Japanese Published Patent Application No. 2015-228492 or United States Patent Application Publication No. 2015/0325282.

Alternatively, the first memory may be an SRAM using a silicon semiconductor and the second memory may be a spin-transfer-torque magnetoresistive random access memory (STT-MRAM). For the use as a cache memory, an SRAM consumes less power than an STT-MRAM; however, the probability of occurrence of a soft error of the SRAM is higher than that of the STT-MRAM. Therefore, the use of an SRAM in an environment where a soft error is less likely to occur can reduce power consumption and the use of an STT-MRAM in an environment where a soft error is likely to occur can prevent data from being damaged.

Another embodiment of the present invention is a semiconductor device including a first memory, a second memory, a processor, and a selector. The selector enables data to be transmitted from the processor to one of the first memory and the second memory and enables data to be transmitted from the one of the first memory and the second memory to the processor. The probability of occurrence of a soft error of the first memory is higher than the probability of occurrence of a soft error of the second memory. A first mode in which the selector enables data to be transmitted from the processor to the second memory and enables data to be transmitted from the second memory to the processor starts when a predetermined number or more of soft errors are detected in the first memory.

Another embodiment of the present invention is an electronic device including a display device, a first memory, a second memory, a processor, and a selector. The selector enables data to be transmitted from the processor to one of the first memory and the second memory and enables data to be transmitted from the one of the first memory and the second memory to the processor. The probability of occurrence of a soft error of the first memory is higher than the probability of occurrence of a soft error of the second memory. The display device includes a reflective display element and a light-emitting display element. A first mode in which the selector enables data to be transmitted from the processor to the second memory and enables data to be transmitted from the second memory to the processor starts when a predetermined number or more of soft errors are detected in the first memory. The reflective display device may include a liquid crystal display element. The light-emitting display device may include an organic EL display element.

In the above embodiment, the technology of the first memory may be smaller than the technology of the second memory.

In the above embodiment, dummy data may be transmitted to the first memory in the first mode and a second mode in which data is enabled to be transmitted from the processor to the first memory and is enabled to be transmitted from the first memory to the processor may start when no soft errors are detected in the first memory in a predetermined period in the first mode.

In the above embodiment, the first memory may be a memory using a silicon semiconductor. The second memory may be one of a memory including a transistor using an oxide semiconductor or an STT-MRAM.

In the above embodiment, the semiconductor device may include a circuit configured to generate check data by an error detection technique using first data transmitted from the processor to the first memory and stored in the first memory and a circuit configured to receive the first data stored in the first memory and the check data and detect an error by performing an arithmetic processing.

According to the present invention, a highly reliable system that stably operates even when the probability of occurrence of a soft error becomes high by the influence of the environment or site of an electronic device can be provided.

BRIEF DESCRIPTION OF THE DRAWINGS

In the accompanying drawings:

FIGS. 15A, 15B1, and 15B2 are cross-sectional views illustrating an example of a manufacturing method of a display device;

DETAILED DESCRIPTION OF THE INVENTION

Figure 1:
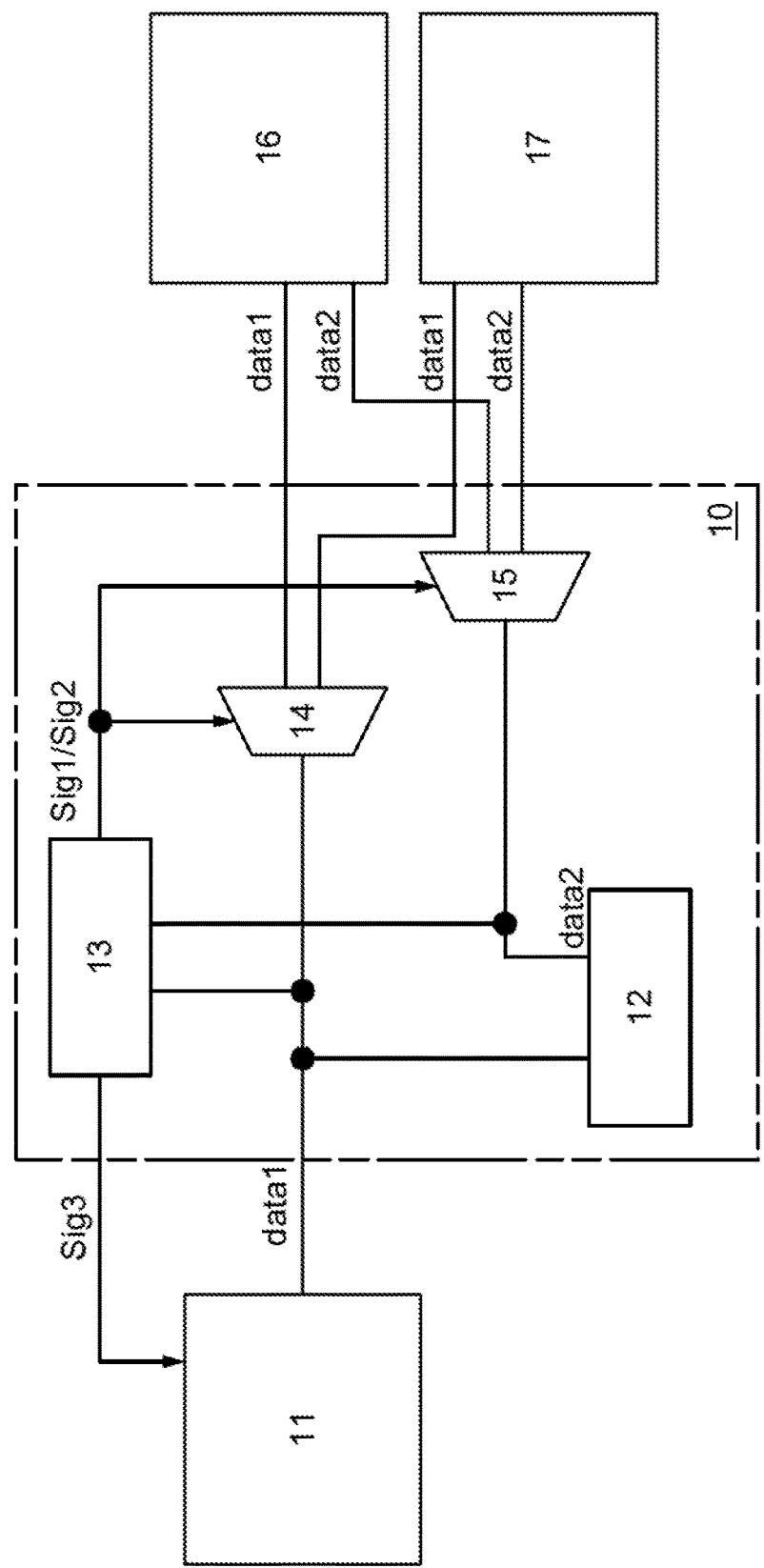
FIG. 1 is a block diagram illustrating a structure example of a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments. A technique described in any of the following embodiments can be combined with a technique described in the embodiment or another technique described in another embodiment.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relationship between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region mainly through which current flows.

Furthermore, functions of a source and a drain might be switched when transistors having different polarities are employed or a direction of current flow is changed in circuit operation, for example. Therefore, the terms "source" and "drain" can be switched in this specification and the like.

In this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" include a switching element such as a transistor, a resistor, an inductor, a capacitor, and an element with a variety of functions as well as an electrode and a wiring.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Embodiment 1

A semiconductor device illustrated in FIG. 1 includes a soft-error tolerance adjustment circuit 10 between a processor 11 and first and second memories 16 and 17. The soft-error tolerance adjustment circuit 10 includes a CRC generation circuit 12, a CRC detection circuit 13, a selector 14, and a selector 15. The first memory 16 may include an error correcting code (ECC) circuit.

The CRC generation circuit 12 can also be referred to as a CRC transmitting portion and generates check data data2 that is calculated on the basis of main data data1. The CRC detection circuit 13 can also be referred to as a CRC receiving portion, and receives the main data data1 and the check data data2 that are transmitted from the first memory 16 or the second memory 17 and detects an error by performing an arithmetic processing.

The CRC detection circuit 13 transmits a first control signal Sig1 or a second control signal Sig2 to each of the selector 14 and the selector 15. The first control signal Sig1 is transmitted when an error is detected and the second control signal Sig2 is transmitted when no errors are detected. The CRC detection circuit 13 also transmits a third control signal Sig3 to the processor 11 when an error is detected.

The selector 14 and the selector 15 select either the first memory 16 or the second memory 17 depending on the first control signal Sig1 or the second control signal Sig2. Here, the first memory 16 is a memory that is relatively highly affected by a soft error due to radiation and the second memory 17 is a memory that is relatively less likely to be affected by a soft error due to radiation. The technology of a memory used as the first memory 16 may be 65 nm or less and the technology of a memory used as the second memory 17 may be 250 nm or more. The first memory 16 may be an SRAM using a silicon semiconductor and the second memory 17 may be an STT-MRAM. Alternatively, the first memory 16 may be an SRAM using a silicon semiconductor and the second memory 17 may be a memory using a transistor whose channel is formed in a thin-film oxide semiconductor. The first memory 16 and the second memory 17 are not limited to the above examples.

The CRC detection circuit 13 transmits a signal (the second control signal Sig2) for selecting the first memory 16 to each of the selector 14 and the selector 15 before an error is detected and transmits a signal (the first control signal Sig1) for selecting the second memory 17 to each of the selector 14 and the selector 15 after an error is detected. Consequently, the memory to be used is selected.

Switching between the memories may be performed when inversion of data that is considered to be derived from a soft error is detected once or when the number of times of detection of a soft error exceeds a certain number. For example, switching of the memories may be performed when the number of times of detection of a soft error per unit time exceeds a predetermined number.

Damage to data is not derived only from a soft error. Performing the switching between the memories every time damage to data is detected may be unnecessary as a result. Accordingly, when inversion of data transmitted from the first memory 16 is detected, first, error correction of the data of the first memory is performed in an ECC circuit or the like, for example. Then, the number of errors per unit time is recorded. When the number of errors per unit time changes significantly, it may be determined that errors due to soft errors become dominant.

Although a CRC is used as an inspection method in the above, another inspection method such as a parity check method or an ECC method can also be used.

The parity check method is a method in which an inspection bit, which is called a parity bit, is added to a bit string to detect a 1-bit error from the bit string. The circuit configurations of the detection circuit (receiving portion) 12 and the generation circuit (transmitting portion) 13 are simplified because only 1-bit error needs to be detected. In addition, an error detection technique such as a checksum method or an MD5 hash value method can be used.

The ECC method is a method by which data can be repaired in the case of one error and two or more errors can also be detected at a high probability. The CRC is a more reliable method than the parity check method because a burst error, which is a series of successive bit errors, can be detected. Furthermore, an error correction technique such as a cyclic code method, a hamming code method, or a turbo code method can be used.

Each of the first memory 16 and the second memory 17 may be a volatile memory such as a random access memory (RAM), a nonvolatile memory such as a flash memory, or a combination thereof. As the processor 11, a CPU, a PLD, or an FPGA can be used.

The operation example of the semiconductor device of this embodiment will be described below with reference to FIG. 2, FIG. 3, FIG. 4, FIG. 5, and FIG. 6.

<(1) Case where Data for Operating Processor 11 is Written to First Memory 16 (FIG. 2)>

Data from the processor 11 (hereinafter, referred to as the main data data1) is transmitted to each of the selector 14 and the CRC generation circuit 12. The CRC generation circuit 12 generates CRC data (hereinafter, referred to as the check data data2) based on the main data data1 transmitted to the CRC generation circuit 12 and transmits the data to the selector 15.

A signal (the first control signal Sig1 or the second control signal Sig2), by which either the first memory 16 or the second memory 17 is selected to be used, is transmitted from the CRC detection circuit 13 to each of the selector 14 and the selector 15.

Since the first memory 16 is configured to be used at first, a signal (the second control signal Sig2) for selecting the first memory 16 is transmitted from the CRC detection circuit 13 to each of the selector 14 and the selector 15. As a result, the main data data1 is written to the first memory 16 through the selector 14 and the check data data2 is written to the first memory 16 through the selector 15.

<(2) Case where Data is Read from First Memory 16 and Transmitted to Processor 11 (FIG. 3)>

The main data data1 and the check data data2 are read from the first memory 16 and the main data data1 and the check data data2 are transmitted to the selector 14 and the selector 15, respectively. Since the second control signal Sig2 is output from the CRC detection circuit 13, the main data data1 is transmitted to the CRC detection circuit 13 through the selector 14 and the check data data2 is transmitted to the CRC detection circuit 13 through the selector 15. Then, an arithmetic operation is performed using the main data data1 and the check data data2 in the CRC detection circuit 13. In the case where it is determined that the main data data1 is not damaged, the processor 11 can receive the main data data1 as that is.

<(3) Case where Data Read from First Memory 16 is Damaged (FIG. 4)>

In the case where it is determined by the CRC detection circuit 13 that the main data data1 or the check data data2 is damaged, the third control signal Sig3, which instructs the processor 11 not to read the main data data1, is transmitted from the CRC detection circuit 13 to the processor 11.

It is preferably set that the third control signal Sig3 be generated for a certain period only when it is determined that the main data data1 or the check data data2 is damaged while the second control signal Sig2 is transmitted.

Consequently, the processor 11 cannot read the main data data1. A signal (the first control signal Sig1) for selecting the second memory 17 is transmitted from the CRC detection circuit 13 to each of the selector 14 and the selector 15. The first control signal Sig1 is retained for a predetermined period, until the semiconductor device is reset, or until it is determined that the data stored in the first memory 16 is not damaged (the details will be described in Embodiment 3). After that, the second control signal Sig2 is transmitted from the CRC detection circuit 13.

Alternatively, the first control signal Sig1 may be released in accordance with a signal from a neutron ray detector provided outside the semiconductor device. Specifically, a signal transmitted from the CRC detection circuit 13 may be changed from the first control signal Sig1 to the second control signal Sig2 when the number of neutrons detected by the neutron ray detector falls below a predetermined number.

It is preferably set that transmission of the third control signal Sig3 is stopped after a certain period after the first control signal Sig1 is generated. Although the processor 11 can receive a signal from the selector 14 after the transmission of the third control signal Sig3 is stopped, the selector 14 is set to select only the second memory 17 by the first control signal Sig1 at this time.

<(4) Case where Data for Operating Processor 11 is Written to Second Memory 17 (FIG. 5)>

The main data data1 is transmitted to each of the selector 14 and the CRC generation circuit 12. The CRC generation circuit 12 generates the check data data2 based on the main data data1 transmitted to the CRC generation circuit 12 and transmits the data to the selector 15. Since the first control signal Sig1 is transmitted from the CRC detection circuit 13 to each of the selector 14 and the selector 15, the main data data1 is written to the second memory 17 through the selector 14 and the check data data2 is written to the second memory 17 through the selector 15.

<(5) Case where Data is Read from Second Memory 17 and Transmitted to Processor 11 (FIG. 6)>

The main data data1 and the check data data2 are read from the second memory 17 and the main data data1 and the check data data2 are transmitted to the selector 14 and the selector 15, respectively. Since the first control signal Sig1 is output from the CRC detection circuit 13, the main data data1 is transmitted to the CRC detection circuit 13 through the selector 14 and the check data data2 is transmitted to the CRC detection circuit 13 through the selector 15. Then, an arithmetic operation is performed using the main data data1 and the check data data2 in the CRC detection circuit 13. In the case where it is determined that the main data data1 is not damaged, the processor 11 can receive the main data data1 as that is.

In the case where a memory with lower probability of occurrence of a soft error than that of the second memory 17 cannot be operatively connected to the processor 11, the step of performing an arithmetic operation using the main data data1 and the check data data2 in the CRC detection circuit 13 may be omitted. This is because there is no memory that is safer than the second memory 17 even when the main data data1 read from the second memory 17 is damaged.

Alternatively, even when a memory with lower probability of occurrence of a soft error than that of the second memory 17 cannot be operatively connected to the processor 11, an arithmetic operation may be performed using the main data data1 and the check data data2 in the CRC detection circuit 13. In this case, if the main data data1 or the check data data2 is damaged, the processor 11 cannot read the main data data1 (that may be damaged) because the third control signal Sig3 is output from the CRC detection circuit 13. Consequently, a malfunction of the device that is caused when the processor 11 reads damaged data can be prevented.

Embodiment 2

In Embodiment 1, if one of the main data data1 and the check data data2 that are stored in the first memory 16 is damaged, the processor 11 cannot read data transmitted from the first memory 16 because the third control signal Sig3 is transmitted from the CRC detection circuit 13 to the processor 11.

When the first control signal Sig1 is transmitted from the CRC detection circuit 13 to the selector 14 in this state, the processor 11 cannot use the data stored in the first memory 16 and the data is abandoned. However, if the data is not seriously damaged, the data may be repaired early and transferred to the second memory or another memory or a storage medium that is less likely to be affected by a soft error.

In the case where the first memory 16 includes an ECC circuit, for example, error correction of the data stored in the first memory 16 may be performed in synchronization with the third control signal Sig3. Although the second control signal Sig2 is transmitted from the CRC detection circuit 13 to the selector 14 during this process, the processor 11 cannot read the data transmitted from the first memory 16 because the third control signal Sig3 is transmitted to the processor 11.

After the error correction of the data stored in the first memory 16 is completed, the transmission of the third control signal Sig3 is stopped, whereby the processor 11 can read the data transmitted from the first memory 16. Then, the semiconductor device enters a transfer mode and the data stored in the first memory 16 is transferred to a memory or storage medium outside the semiconductor device through the processor 11.

At this time, the main data data1 and the check data data2 are transmitted from the first memory 16 to the CRC detection circuit 13 and it is inspected whether the data are damaged or not. When not damaged, the main data data1 and the check data data2 are transferred to the processor 11 as those are and the processor 11 can read the data transmitted thereto.

If damage to data is detected, the third control signal Sig3 is transmitted from the CRC detection circuit 13 to the processor 11 again, the processor 11 stops reading the data, and the transfer mode is suspended. Meanwhile, error correction of the data stored in the first memory 16 is performed again.

After the second error correction is completed, the transfer mode is resumed and necessary data is transmitted from the first memory 16 to the processor 11 and the CRC detection circuit 13. In this manner, as much data stored in the first memory 16 as possible can be transferred to a safer memory or storage medium.

In general, data is sequentially transferred in a packet format with a certain size. For example, 128 packets of data are stored in the first memory. In the case where damage to one packet of data is detected when the data is transferred to the processor, error correction of the data stored in the first memory is performed.

Next, the semiconductor device enters the transfer mode (first transfer). In the first transfer, for example, the 1st to 95th packets of data can be transferred successfully but damage to the 96th packet of data is detected when the data is transferred. The processor 11 fails to read the 96th packet of data and the transfer mode is suspended. Meanwhile, error correction of the data stored in the first memory is performed again.

After the error correction is completed, the transfer mode is resumed (second transfer). In the second transfer, for example, the 96th to 109th packets of data can be transferred successfully but damage to the 110th packet of data is detected when the data is transferred. The processor 11 fails to read the 110th packet of data and the transfer mode is suspended. Meanwhile, error correction of the data stored in the first memory is performed again.

After the error correction, the transfer mode is resumed (third transfer). In the third transfer, for example, damage to the 110th packet of data is detected again when the data is transferred. The processor 11 fails to read the 110th packet of data and the transfer mode is suspended.

In the case where the transfer of the 110th packet of data is failed more than once as described above, it is determined that the 110th packet of data is unrepairable and the 111th to 128th packets of data are transferred. In the case where transfer of one packet of data is successively failed twice, for example, it is determined that the packet of data is unrepairable. Alternatively, in the case where transfer of one packet of data is failed once, it may be determined that the packet of data is unrepairable.

In such a manner, as much repairable data as possible can be extracted from the first memory 16. After the transfer mode is completed, the CRC detection circuit 13 transmits the first control signal Sig1 to each of the selector 14 and the selector 15 and stops the transmission of the third control signal Sig3. Consequently, the processor 11 and the second memory 17 can be operatively connected to each other. The data extracted from the first memory 16 and transferred to a memory or storage medium outside the semiconductor device is stored in the second memory 17 through the processor 11.

Modification Example

Although the above is an example in which the data stored in the first memory 16 is transferred to a memory or storage medium outside the semiconductor device, the data may be transferred to the second memory 17 through the processor 11. Note that when the storage capacity of the first memory 16 is smaller than that of the second memory 17, some data stored in the first memory 16 cannot be transferred to the second memory 17 in some cases.

In the case where the data may be transferred to the second memory 17 through the processor 11, a data transmission operation from the first memory 16 to the processor 11 and a data transmission operation from the processor 11 to the second memory 17 are repeatedly performed in the transfer mode. When the data transmission operation is performed, the first control signal Sig1 and the second control signal Sig2 are alternately transmitted from the CRC detection circuit 13 to each of the selector 14 and the selector 15 so as to correspond to the above operations.

Specifically, the second control signal Sig2 is transmitted to each of the selector 14 and the selector 15 when data is transmitted from the first memory 16 to the processor 11, and the first control signal Sig1 is transmitted to each of the selector 14 and the selector 15 when data is transmitted from the processor 11 to the second memory 17.

In the case where damage to data is detected when the data is transmitted from the first memory 16 to the processor 11, the CRC detection circuit 13 transmits the third control signal Sig3 to the processor 11, whereby the transfer mode is suspended. After error correction of the data is performed in the first memory 16 in the above-described manner, the transfer mode is resumed.

Embodiment 3

In this embodiment, an example in which the semiconductor device in Embodiment 1 has the following additional function will be described: a function of using the first memory 16 instead of the second memory 17 when a state in which the first control signal Sig1 is transmitted from the CRC detection circuit 13 by detection of a soft error so that the processor 11 and the second memory 17 can be operatively connected to each other is changed into a state in which the semiconductor device is moved to a place which is less likely to be affected by radiation, for example.

Figure 7:
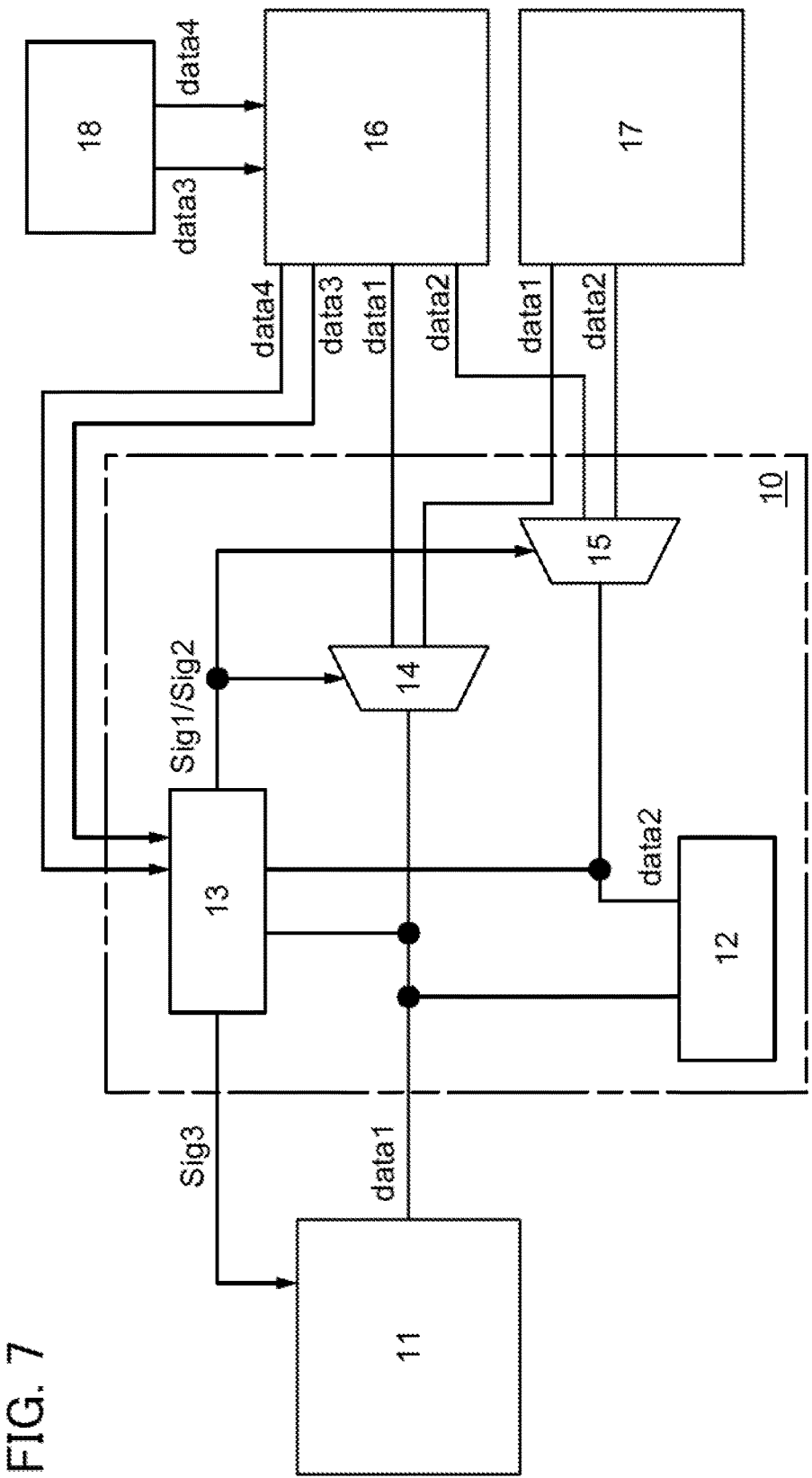
FIG. 7 is a block diagram illustrating a structure example of a semiconductor device of one embodiment of the present invention.

FIG. 7 is a block diagram of the semiconductor device in the case of switching from the second memory 17 with low probability of occurrence of a soft error to the first memory 16 with high probability of occurrence of a soft error. The semiconductor device illustrated in FIG. 7 includes the soft-error tolerance adjustment circuit 10 (the CRC generation circuit 12, the CRC detection circuit 13, the selector 14, and the selector 15 are included), the processor 11, the first memory 16, and the second memory 17. The semiconductor device illustrated in FIG. 7 further includes a dummy data transmission circuit 18.

The dummy data transmission circuit 18 may be a circuit capable of transmitting a predetermined signal and is not necessarily a large-scale circuit like a CPU. The dummy data transmission circuit 18 can transmit dummy data (hereinafter, referred to as main dummy data data3) with the same number of bits as the main data data1 that is transmitted from the processor 11 and CRC data (hereinafter, referred to as check dummy data data4) that is calculated on the basis of the main dummy data data3 to the first memory 16.

For example, the dummy data transmission circuit 18 may include a read-only memory (ROM) and be configured to transmit the main dummy data data3 and the check dummy data data4 to a specified address of the first memory 16.

When the first memory 16 has 1024 rows, for example, the main dummy data data3 and the check dummy data data4 are transmitted and written to the first row and the main dummy data data3 and the check dummy data data4 are transmitted and written to the second row after a certain period. After the writing operation is repeated up to the 1024th row, the main dummy data data3 and the check dummy data data4 are read from the first row after a certain period.

When the length of a period from the start of the writing to the first row to the start of the writing to the second row is 1 second, for example, the main dummy data data3 and the check dummy data data4 stored in the first row are retained in the first memory 16 for 1024 seconds. As a period during which the main dummy data data3 and the check dummy data data4 are retained in the first row of the first memory 16 becomes longer, the probability that the data are damaged becomes higher.

Whether the main dummy data data3 is damaged or not can be determined by performing an arithmetic operation using the main dummy data data3 and the check dummy data data4 in the CRC detection circuit 13.

When the main dummy data data3 transmitted from the dummy data transmission circuit 18 is composed of 8 bits, for example, 00000000, 11111111, 01010101, or the like can be used as the main dummy data data3. Alternatively, the main dummy data data3 may be composed of a different number of bits from that of the main data data1. For example, the main dummy data data3 may be composed of 8 bits as described above and the main data data1 may be composed of 32 bits.

The main dummy data data3 needs to be composed of data that sensitively react to a soft error. If a soft error is likely to occur to data "0" or data "1" in the first memory 16, the main dummy data data3 composed only of data to which a soft error is more likely to occur can be sensitive to occurrence of a soft error.

For example, when the data "1" has a higher probability of occurrence of a soft error than the data "0", a soft error is likely to occur to 11111111. In the case of a memory in which the data "0" is not inverted to the data "1" in principle under any conditions, the main dummy data data3 should not be 00000000.

When the main dummy data data3 is 11111111 and a divisor (generator polynomial) of a CRC is 10011, which is defined by CRC-4-ITU, the check dummy data data4 is 1101, which is a 4-bit value.

A divisor of a CRC used for an arithmetic operation using the main dummy data data3 and the check dummy data data4 may be different from that used for an arithmetic operation using the main data data1 and the check data data2. For example, a divisor of a CRC used for an arithmetic operation using the main dummy data data3 and the check dummy data data4 may be 10011 as described above and a divisor of a CRC used for an arithmetic operation using the main data data1 and the check data data2 may be 110101, which is defined by CRC-5-ITU.

Figure 8:
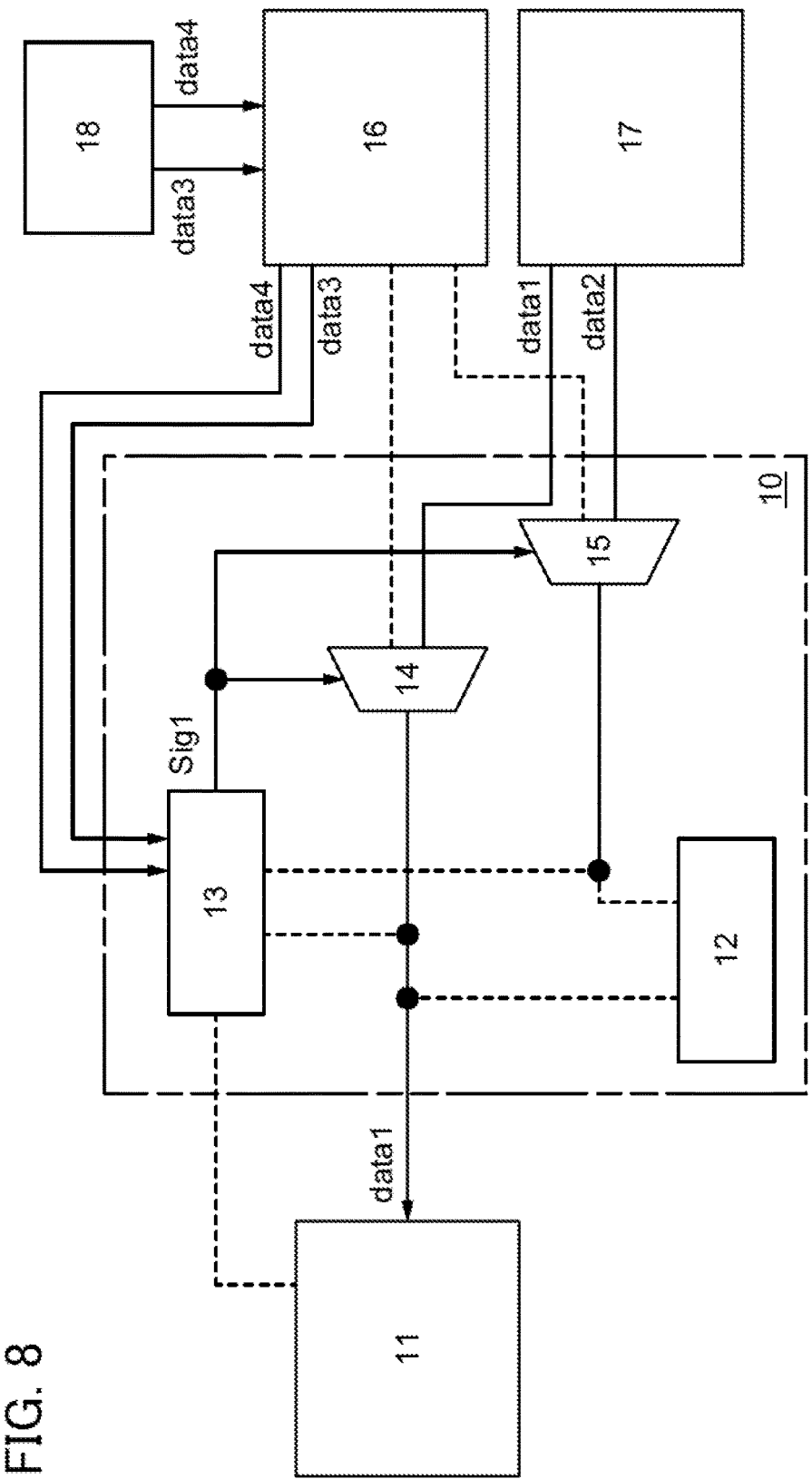
FIG. 8 is a block diagram illustrating an operation example of a semiconductor device of one embodiment of the present invention.

An operation example of the semiconductor device of this embodiment will be described with reference to FIG. 8. Since the first control signal Sig1 is transmitted from the CRC detection circuit 13 to each of the selector 14 and the selector 15 in FIG. 8, only the main data data1 from the second memory 17 is transmitted to the processor 11. Although the main data data1 and the check data data2 are also transmitted from the second memory 17 to the CRC detection circuit 13, the CRC detection circuit 13 does not necessarily need to receive the main data data1 and the check data data2.

For example, the CRC detection circuit 13 may be configured not to receive the main data data1 and the check data data2 while generating the first control signal Sig1; thus, the CRC detection circuit 13 may be configured not to perform an arithmetic operation using the data.

Alternatively, the CRC detection circuit 13 may be configured to perform an arithmetic operation using the main dummy data data3 and the check dummy data data4 and determine whether one of those is damaged or not while generating the first control signal Sig1.

The main dummy data data3 and the check dummy data data4 are transmitted from the dummy data transmission circuit 18 to the first memory 16 constantly or at a predetermined interval while the second memory 17 is used. The timing of the transmission may be arbitrarily determined by a user. After the main dummy data data3 and the check dummy data data4 that are transmitted to the first memory 16 are stored in the first memory 16 for a certain period as described above, the main dummy data data3 and the check dummy data data4 are transmitted to the CRC detection circuit 13.

In an environment where a soft error is more likely to occur, it is highly possible that one of the main dummy data data3 and the check dummy data data4 that are stored in the first memory 16 is damaged. When the data is damaged, the CRC detection circuit 13 can detect an error. At this time, since the CRC detection circuit 13 continuously transmits the first control signal Sig1 to each of the selector 14 and the selector 15, the data in the first memory 16 is not transmitted to the processor 11. The processor 11 can receive only the data from the second memory 17.

In an environment where a soft error is less likely to occur, the possibility that one of the main dummy data data3 and the check dummy data data4 that are stored in the first memory 16 is damaged is low. When neither the main dummy data data3 nor the check dummy data data4 is damaged, the CRC detection circuit 13 detects no errors.

In the case where this condition is achieved once, a predetermined number of times, or at a predetermined time, it is preferably set that a signal (the second control signal Sig2) for selecting the first memory 16 is transmitted from the CRC detection circuit 13 to each of the selector 14 and the selector 15. For example, it may be set that the second control signal Sig2 is transmitted when the number of times of detection of a soft error per unit time falls below a predetermined number. Accordingly, the data of the first memory 16 can be transmitted to the processor 11.

Modification Example 1

In the above-described method, an arithmetic operation using the main data data1 and the check data data2 and an arithmetic operation using the main dummy data data3 and the check dummy data data4 are performed in the CRC detection circuit 13. In the arithmetic operation using the main data data1 and the check data data2, the main data data1 is not a specific value, and thus the check data data2 is also not a specific value.

On the contrary, in the arithmetic operation using the main dummy data data3 and the check dummy data data4, the main dummy data data3 can be a specific value (in the above example, 11111111), and thus the check dummy data data4 can also be a specific value (in the above example, 1000).

Figure 9:
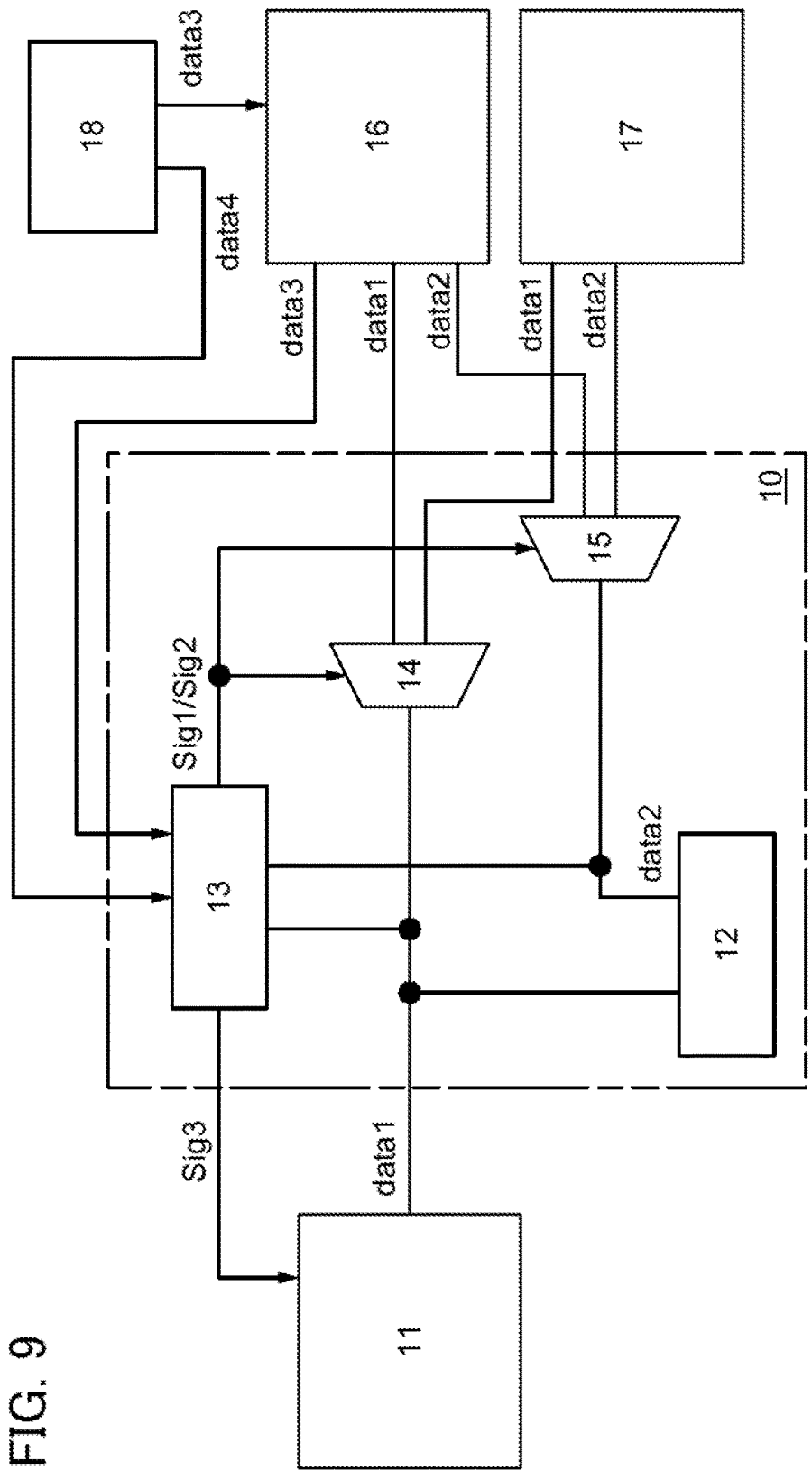
FIG. 9 is a block diagram illustrating a structure example of a semiconductor device of one embodiment of the present invention.

Although the check dummy data data4 is also stored in the first memory in the above example, the check dummy data data4 is not necessary stored in the first memory, and may be directly transmitted from the dummy data transmission circuit 18 to the CRC detection circuit 13 as illustrated in FIG. 9, for example. Alternatively, the check dummy data data4 may be originally stored in the CRC detection circuit 13.

Modification Example 2

Since the main dummy data can be a specific value as described above, a so-called arithmetic processing is not needed. For example, data "1" may be stored in all the memory bits of the first memory 16 and read after a certain period. Then, whether the data is inverted or not (in other words, whether data "1" is changed to data "0" or not) may be determined. This operation may be performed in the CRC detection circuit 13 or another circuit. When it is determined that the number of inverted data is sufficiently small, the CRC detection circuit 13 may be configured to transmit the second control signal Sig2 to each of the selector 14 and the selector 15.

Embodiment 4

Figure 10:
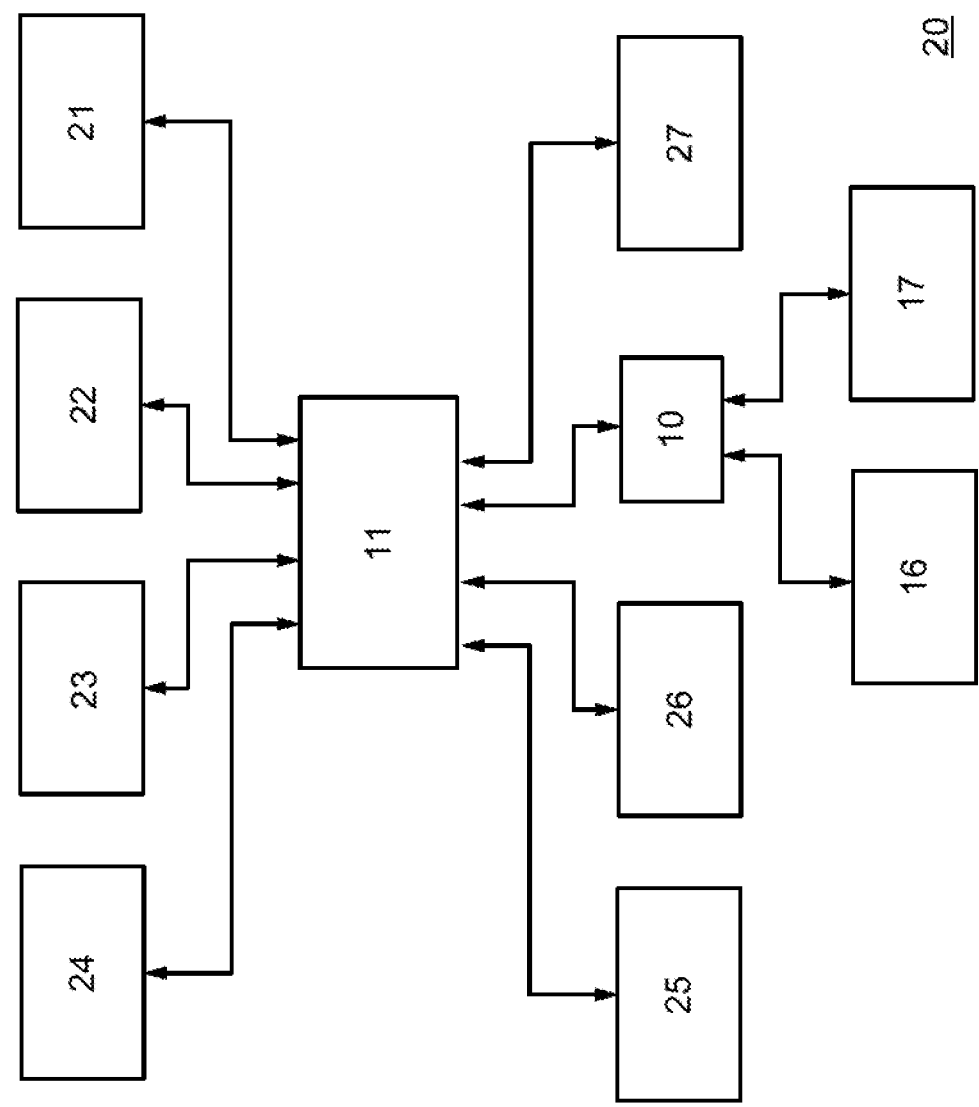
FIG. 10 is a block diagram illustrating an example of a system of an electronic device of one embodiment of the present invention.

FIG. 10 is a block diagram illustrating an example of components of an electronic device using the semiconductor device of Embodiments 1 to 3. The electronic device can be a portable computer such as a laptop computer, a notebook computer, or a tablet computer, a hand-held electronic device such as a digital media player, a cellular phone, or a smartphone, or the like. The soft-error tolerance adjustment circuit 10, the processor 11, the first memory 16, and the second memory 17 of an electronic device 20 illustrated in FIG. 10 correspond to those described in Embodiments 1 to 3.

The electronic device 20 can include various internal components and external components. In this embodiment, the electronic device 20 can include the soft-error tolerance adjustment circuit 10, the processor 11, the first memory 16, the second memory 17, an input/output port 21, an input portion 22, a network device 23, a display 24, a power source 25, a non-volatile memory device 26, an imaging device 27, and the like. As the processor 11, a CPU or a multiprocessor including a CPU and an image processor or a video processor can be used.

The processor 11 can control the entire operation of the electronic device 20. Examples of the input/output port 21 can include a port that is configured to be connected to a power source, an audio output device (e.g., a headset or headphones), or a hand-held device, and/or another external device such as a printer, a projector, or an external display.

The input portion 22 can supply input by a user or feedback to the processor 11. Examples of the input portion 22 can include a microphone, a keyboard, a mouse, a touch pad, a touch sensor, or a combination thereof. When a touch sensor is used as the input portion 22, the touch sensor and the display 24 may be provided in combination. The processor 11 can process an input signal that is received through an input device. As the display 24, an active-matrix display device such as an organic EL display device or a liquid crystal display device may be used.

An instruction or data processed by the processor 11 can be stored in the first memory 16 (or the second memory 17). The first memory 16 and the second memory 17 can store firmware executed in the electronic device 20 such as a basic input/output system (BIOS), an operating system, various programs, application, or another arbitrary routine executed in the electronic device 20 including functions of a user interface, a processor, and the like. Furthermore, the first memory 16 and the second memory 17 can be used for buffering or caching data during the operation of the electronic device 20.

The electronic device can include the non-volatile memory device 26 that is a flash memory, a hard disk, or the like in addition to the first memory 16 and the second memory 17.

Furthermore, the electronic device 20 includes the network device 23. As the network device 23, a Wi-Fi device, a radio frequency device, a Bluetooth (registered trademark) device, a cellular communication device, or the like can be used.

The power source 25 may be one or more batteries such as a lithium-ion battery, an AC power source, or a combination thereof.

As described above, according to this embodiment, a memory in which a soft error is likely to occur and a memory in which a soft error is less likely to occur are selectively used by a circuit that monitors occurrence of a soft error due to radiation or the like in order to autonomously adjust soft-error tolerance in accordance with the environment or a change in the environment. Consequently, a system stop due to the cause of a soft error such as radiation can be prevented, so that operational stability and reliability of the system can be improved.

Embodiment 5

An example in which a hybrid display device in which a self-luminous display element and a reflective display element are provided in combination is used as the display 24 of Embodiment 4 will be described.

The display device of this embodiment has a structure where a first display panel and a second display panel are bonded to each other with an adhesive layer therebetween. In the first display panel, first pixels that include reflective display elements are provided. In the second display panel, second pixels that include light-emitting elements are provided. Although a liquid crystal element is used as a reflective display element in this embodiment, an electrophoretic display element or the like may be used as the reflective display element. The reflective display elements can produce gray levels by controlling the amount of reflected light. The light-emitting elements can produce gray levels by controlling the amount of light emission.

The display device can perform display by using only reflected light, display by using only light emitted from the light-emitting elements, and display by using both reflected light and light emitted from the light-emitting elements, for example.

The first display panel is provided on the viewing side. The second display panel is provided on the side opposite to the viewing side. The first display panel includes a first resin layer in a position closest to the adhesive layer. The second display panel includes a second resin layer in a position closest to the adhesive layer.

It is preferable that a third resin layer be provided on the display surface side of the first display panel and a fourth resin layer be provided on the rear surface side (the side opposite to the display surface side) of the second display panel. Thus, the display device can be extremely lightweight and less likely to be broken.

The first to fourth resin layers (hereinafter, also collectively referred to as a resin layer) have a feature of being extremely thin. Specifically, it is preferable that each of the resin layers have a thickness of 0.1 μm or more and 3 μm or less. Thus, even a structure where the two display panels are stacked can have a small thickness. Furthermore, light absorption due to the resin layer positioned in the path of light emitted from the light-emitting element in the second pixel can be reduced, so that light can be extracted with higher efficiency and the power consumption can be reduced.

The resin layer can be formed in the following manner, for example. A thermosetting resin material with a low viscosity is applied to a support substrate and cured by heat treatment to form the resin layer. Then, a structure is formed over the resin layer. Then, the resin layer and the support substrate are separated from each other, whereby one surface of the resin layer is exposed.

As a method of reducing adhesion between the support substrate and the resin layer to separate the support substrate and the resin layer from each other, laser light irradiation is given. For example, the irradiation by scanning using linear laser light may be performed. By the method, the process time of the case of using a large support substrate can be shortened. As the laser light, excimer laser light with a wavelength of 308 nm can be suitably used. The method of reducing adhesion is not limited to laser light irradiation and may be another method such as heat treatment.

A thermosetting polyimide is a typical example of a material that can be used for the resin layer. It is particularly preferable to use a photosensitive polyimide. A photosensitive polyimide is a material that is suitably used for formation of a planarization film or the like of the display panel, and therefore, the formation apparatus and the material can be shared. Thus, there is no need to prepare another apparatus and another material to obtain the structure of one embodiment of the present invention.

Furthermore, the resin layer that is formed using a photosensitive resin material can be processed by light exposure and development treatment. For example, an opening can be formed and an unnecessary portion can be removed. Moreover, by optimizing a light exposure method or light exposure conditions, an uneven shape can be formed in a surface of the resin layer. For example, an exposure technique using a half-tone mask or a gray-tone mask or a multiple exposure technique may be used.

Note that a non-photosensitive resin material may be used. In that case, a method of forming an opening or an uneven shape using a resist mask or a hard mask that is formed over the resin layer can be used.

In this case, part of the resin layer that is positioned in the path of light emitted from the light-emitting element is preferably removed. That is, an opening overlapping with the light-emitting element is provided in the first resin layer and the second resin layer. Thus, a reduction in color reproducibility and light extraction efficiency that is caused by absorption of part of light emitted from the light-emitting element by the resin layer can be inhibited.

Alternatively, the resin layer may be provided with a concave portion so that a portion of the resin layer that is positioned in the path of light emitted from the light-emitting element is thinner than the other portion. That is, the resin layer may have a structure where two portions with different thicknesses are included and the portion with a smaller thickness overlaps with the light-emitting element. The resin layer that has the structure can also reduce absorption of light emitted from the light-emitting element.

In the case where the first display panel includes the third resin layer, an opening overlapping with the light-emitting element is preferably provided in a manner similar to that described above. Thus, color reproducibility and light extraction efficiency can be further increased.

In the case where the first display panel includes the third resin layer, part of the third resin layer that is positioned in the path of light of the reflective liquid crystal element is preferably removed. That is, an opening overlapping with the reflective liquid crystal element is provided in the third resin layer. This can increase the reflectivity of the reflective liquid crystal element.

In the case where the opening is formed in the resin layer, a light absorption layer is formed over the support substrate, the resin layer having the opening is formed over the light absorption layer, and a light-transmitting layer covering the opening is formed. The light absorption layer is a layer that emits a gas such as hydrogen or oxygen by absorbing light and being heated. By performing light irradiation from the support substrate side to make the light absorption layer emit a gas, adhesion at the interface between the light absorption layer and the support substrate or between the light absorption layer and the light-transmitting layer can be reduced to cause separation, or the light absorption layer itself can be broken to cause separation.

As another example, the following method can be used. That is, a thin part is formed in a portion where the opening of the resin layer is to be formed, and the support substrate and the resin layer are separated from each other by the above-described method. Then, plasma treatment or the like is performed on a separated surface of the resin layer to reduce the thickness of the resin layer, whereby the opening can be formed in the thin part of the resin layer.

Each of the first pixel and the second pixel preferably includes a transistor. Furthermore, an oxide semiconductor is preferably used as a semiconductor where a channel of the transistor is formed. An oxide semiconductor can achieve high on-state current and high reliability even when the highest temperature in the manufacturing process of the transistor is reduced (e.g., 400° C. or lower, preferably 350° C. or lower). Furthermore, in the case of using an oxide semiconductor, high heat resistance is not required for a material of the resin layer positioned on the surface side on which the transistor is formed; thus, the material of the resin layer can be selected from a wider range of alternatives. For example, the material can be the same as a resin material of the planarization film.

In the case of using low-temperature polysilicon (LTPS), for example, processes such as a laser crystallization process, a baking process before crystallization, and a baking process for activating impurities are required, and the highest temperature in the manufacturing process of the transistor is higher than that in the case of using an oxide semiconductor (e.g., higher than or equal to 500° C., higher than or equal to 550° C., or higher than or equal to 600° C.), though high field-effect mobility can be obtained. Therefore, high heat resistance is required for the resin layer positioned on the surface side on which the transistor is formed. In addition, the thickness of the resin layer needs to be comparatively large (e.g., larger than or equal to 10 μm, or larger than or equal to 20 μm) because the resin layer is also irradiated with laser light in the laser crystallization process.

In contrast, in the case of using an oxide semiconductor, a special material having high heat resistance is not required for the resin layer, and the resin layer needs to be formed thick. Thus, the proportion of the cost of the resin layer in the cost of the whole display panel can be reduced.

An oxide semiconductor has a wide band gap (e.g., 2.5 eV or more, or 3.0 eV or more) and transmits light. Thus, even when an oxide semiconductor is irradiated with laser light in a step of separating the support substrate and the resin layer, the laser light is hardly absorbed, so that the electrical characteristics can be less affected. Therefore, the resin layer can be thin as described above.

In one embodiment of the present invention, a display device excellent in productivity can be obtained by using both a resin layer that is formed thin using a photosensitive resin layer with a low viscosity typified by a photosensitive polyimide and an oxide semiconductor with which a transistor having excellent electrical characteristics can be obtained even at a low temperature.

Next, a pixel structure will be described. The first pixels and the second pixels are arranged in a matrix to form the display portion. In addition, the display device preferably includes a first driver portion for driving the first pixels and a second driver portion for driving the second pixels. It is preferable that the first driver portion be provided in the first display panel and the second driver portion be provided in the second display panel.

The first pixels and the second pixels are preferably arranged in a display region with the same pitch. Furthermore, the first pixels and the second pixels are preferably mixed in the display region of the display device. Accordingly, as described later, an image displayed by a plurality of first pixels, an image displayed by a plurality of second pixels, and an image displayed by both the plurality of first pixels and the plurality of second pixels can be displayed in the same display region.

Next, transistors that can be used in the first display panel and the second display panel will be described. A transistor provided in the first pixel of the first display panel and a transistor provided in the second pixel of the second display panel may have either the same structure or different structures.

As a structure of the transistor, a bottom-gate structure is given, for example. A transistor having a bottom-gate structure includes a gate electrode below a semiconductor layer. A source electrode and a drain electrode are provided in contact with a top surface and a side end portion of the semiconductor layer, for example.

As another structure of the transistor, a top-gate structure is given, for example. A transistor having a top-gate structure includes a gate electrode above a semiconductor layer. A first source electrode and a first drain electrode are provided over an insulating layer covering part of a top surface and a side end portion of the semiconductor layer and are electrically connected to the semiconductor layer through openings provided in the insulating layer, for example.

The transistor preferably includes a first gate electrode and a second gate electrode that face each other with the semiconductor layer provided therebetween.

A more specific example of the display device of one embodiment of the present invention will be described below with reference to drawings.

Structure Example 1

Figure 11:
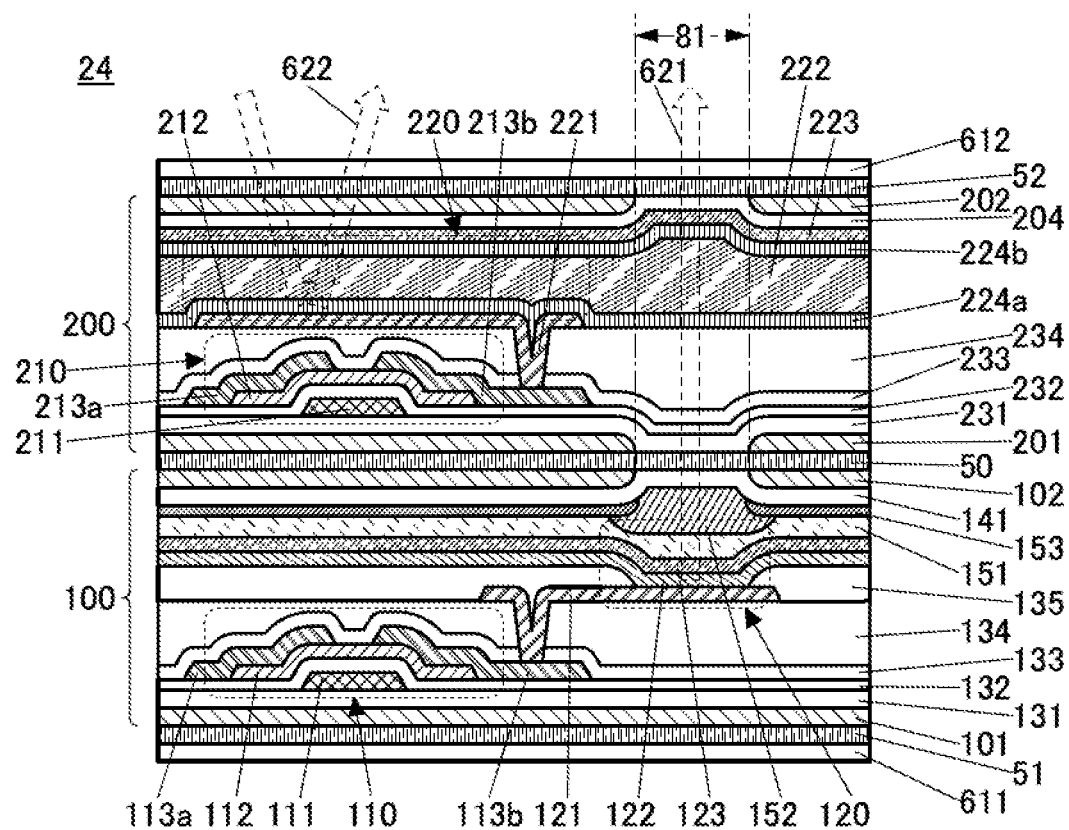
FIG. 11 is a cross-sectional view illustrating a structure example of a display device.

FIG. 11 is a schematic cross-sectional view of the display 24. In the display 24, a display panel 100 and a display panel 200 are bonded to each other using an adhesive layer 50. The display 24 includes a substrate 611 on the rear side (the side opposite to the viewing side) and a substrate 612 on the front side (the viewing side).

The display panel 100 includes a transistor 110 and a light-emitting element 120 between a resin layer 101 and a resin layer 102. The display panel 200 includes a transistor 210 and a liquid crystal element 220 between a resin layer 201 and a resin layer 202. The resin layer 101 is bonded to the substrate 611 with an adhesive layer 51 positioned therebetween. The resin layer 202 is bonded to the substrate 612 with an adhesive layer 52 positioned therebetween.

The resin layer 102, the resin layer 201, and the resin layer 202 are each provided with an opening. A region 81 illustrated in FIG. 11 is a region overlapping with the light-emitting element 120 and overlapping with the opening of the resin layer 102, the opening of the resin layer 201, and the opening of the resin layer 202.

[Display Panel 100]

The resin layer 101 is provided with the transistor 110, the light-emitting element 120, an insulating layer 131, an insulating layer 132, an insulating layer 133, the insulating layer 134, the insulating layer 135, and the like. The resin layer 102 is provided with a light-blocking layer 153, a coloring layer 152, and the like. The resin layer 101 and the resin layer 102 are bonded to each other using the adhesive layer 151.

The transistor 110 is provided over the insulating layer 131 and includes a conductive layer 111 serving as a gate electrode, part of the insulating layer 132 serving as a gate insulating layer, a semiconductor layer 112, a conductive layer 113*a* serving as one of a source electrode and a drain electrode, and a conductive layer 113*b* serving as the other of the source electrode and the drain electrode.

The semiconductor layer 112 preferably includes an oxide semiconductor.

The insulating layer 133 and the insulating layer 134 cover the transistor 110. The insulating layer 134 serves as a planarization layer.

The light-emitting element 120 includes the conductive layer 121, the EL layer 122, and the conductive layer 123 that are stacked. The conductive layer 121 has a function of reflecting visible light, and the conductive layer 123 has a function of transmitting visible light. Therefore, the light-emitting element 120 is a light-emitting element having a top-emission structure which emits light to the side opposite to the formation surface side.

The conductive layer 121 is electrically connected to the conductive layer 113*b* through an opening provided in the insulating layer 134 and the insulating layer 133. The insulating layer 135 covers an end portion of the conductive layer 121 and is provided with an opening to expose a top surface of the conductive layer 121. The EL layer 122 and the conductive layer 123 are provided in this order to cover the insulating layer 135 and the exposed portion of the conductive layer 121.

An insulating layer 141 is provided on the resin layer 101 side of the resin layer 102. The light-blocking layer 153 and the coloring layer 152 are provided on the resin layer 101 side of the insulating layer 141. The coloring layer 152 is provided in a region overlapping with the light-emitting element 120. The light-blocking layer 153 includes an opening in a portion overlapping with the light-emitting element 120.

The insulating layer 141 covers the opening of the resin layer 102. A portion of the insulating layer 141 that overlaps with the opening of the resin layer 102 is in contact with the adhesive layer 50.

[Display Panel 200]

The resin layer 201 is provided with the transistor 210, the conductive layer 221, an alignment film 224*a*, an insulating layer 231, an insulating layer 232, an insulating layer 233, an insulating layer 234, and the like. The resin layer 202 is provided with an insulating layer 204, a conductive layer 223, an alignment film 224b, and the like. Liquid crystal 222 is interposed between the alignment film 224a and the alignment film 224b. The resin layer 201 and the resin layer 202 are bonded to each other using an adhesive layer in a region not illustrated.

The transistor 210 is provided over the insulating layer 231 and includes a conductive layer 211 serving as a gate electrode, part of the insulating layer 232 serving as a gate insulating layer, a semiconductor layer 212, a conductive layer 213a serving as one of a source electrode and a drain electrode, and a conductive layer 213b serving as the other of the source electrode and the drain electrode.

The semiconductor layer 212 preferably includes an oxide semiconductor.

The insulating layer 233 and the insulating layer 234 cover the transistor 210. The insulating layer 234 serves as a planarization layer.

The liquid crystal element 220 includes the conductive layer 221, the conductive layer 223, and the liquid crystal 222 interposed therebetween. The conductive layer 221 has a function of reflecting visible light, and the conductive layer 223 has a function of transmitting visible light. Therefore, the liquid crystal element 220 is a reflective liquid crystal element.

The conductive layer 221 is electrically connected to the conductive layer 213b through an opening provided in the insulating layer 234 and the insulating layer 233. The alignment film 224a covers surfaces of the conductive layer 221 and the insulating layer 234.

The conductive layer 223 and the alignment film 224b are stacked on the resin layer 201 side of the resin layer 202. Note that the insulating layer 204 is provided between the resin layer 202 and the conductive layer 223. In addition, a coloring layer for coloring light reflected by the liquid crystal element 220 may be provided.

The insulating layer 231 covers the opening of the resin layer 201. A portion of the insulating layer 231 that overlaps with the opening of the resin layer 202 is in contact with the adhesive layer 50. The insulating layer 204 covers the opening of the resin layer 202. A portion of the insulating layer 204 that overlaps with the opening of the resin layer 202 is in contact with the adhesive layer 52.

[Display 24]

The display 24 includes a portion where the light-emitting element 120 does not overlap with the reflective liquid crystal element 220 when seen from above. Thus, the light 621 that is colored by the coloring layer 152 is emitted from the light-emitting element 120 to the viewing side as illustrated in FIG. 11. Furthermore, the reflected light 622 that is external light reflected by the conductive layer 221 is emitted through the liquid crystal 222 of the liquid crystal element 220.

The light 621 emitted from the light-emitting element 120 is emitted to the viewing side through the opening of the resin layer 102, the opening of the resin layer 201, and the opening of the resin layer 202. Since the resin layer 102, the resin layer 201, and the resin layer 202 are not provided in the path of the light 621, even in the case where the resin layer 102, the resin layer 201, and the resin layer 202 absorb part of visible light, high light extraction efficiency and high color reproducibility can be obtained.

Note that the substrate 612 serves as a polarizing plate or a circular polarizing plate. A polarizing plate or a circular polarizing plate may be located outward from the substrate 612.

In the above-described structure of the display panel 200, a coloring layer is not included and color display is not performed, but a coloring layer may be provided on the resin layer 202 side to perform color display.

The above is the description of the structure example.

[Example of Manufacturing Method]

An example of a manufacturing method of the display 24 illustrated in FIG. 11 will be described below with reference to drawings.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a tool (equipment) such as a doctor knife, a slit coater, a roll coater, a curtain coater, or a knife coater.

When thin films included in the display device are processed, a photolithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of the photolithography method include a method in which a photosensitive resist material is applied on a thin film to be processed, the material is exposed to light using a photomask and developed to form a resist mask, the thin film is processed by etching or the like, and the resist mask is removed, and a method in which a photosensitive thin film is formed and then exposed to light and developed to be processed into a desired shape.

As light used for exposure in a photolithography method, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Light exposure may be performed by a liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

[Formation of Resin Layer]

First, a support substrate 61 is prepared. For the support substrate 61, a material having stiffness high enough to facilitate the transfer and having resistance to heat applied in the manufacturing process can be used. For example, a material such as glass, quartz, ceramics, sapphire, an organic resin, a semiconductor, a metal, or an alloy can be used. As the glass, for example, alkali-free glass, barium borosilicate glass, or aluminoborosilicate glass can be used.

Figure 12A:
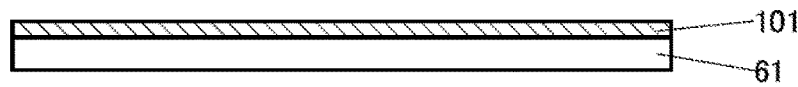
FIGS. 12A to 12E are cross-sectional views illustrating an example of a manufacturing method of a display device.

Next, the resin layer 101 is formed over the support substrate 61 (FIG. 12A).

First, a material to be the resin layer 101 is applied on the support substrate 61. For the application, a spin coating method is preferred because the resin layer 101 can be thinly and uniformly formed over a large substrate.

Alternatively, the resin layer 101 can be formed by dipping, spray coating, ink-jetting, dispensing, screen printing, or offset printing, or with a doctor knife, a slit coater, a roll coater, a curtain coater, or a knife coater, for example.

The material contains a polymerizable monomer exhibiting a thermosetting property (also referred to as a thermopolymerization property) in which case polymerization proceeds by heat. Furthermore, the material is preferably photosensitive. In addition, the material preferably contains a solvent for adjusting the viscosity.

The material preferably contains a polymerizable monomer that becomes a polyimide resin, an acrylic resin, an epoxy resin, a polyamide resin, a polyimide amide resin, a siloxane resin, a benzocyclobutene-based resin, or a phenol resin after polymerization. That is, the formed resin layer 101 contains any of these resin materials. In particular, a polymerizable monomer having an imide bond is preferably used for the material; for example, a resin typified by a polyimide resin is preferably used for the resin layer 101, in which case heat resistance and weatherability can be improved.

The viscosity of the material used for the application is greater than or equal to 5 cP and less than 500 cP, preferably greater than or equal to 5 cP and less than 100 cP, more preferably greater than or equal to 10 cP and less than or equal to 50 cP. The lower the viscosity of the material is, the easier the application is. Furthermore, the lower the viscosity of the material is, the more the entry of bubbles can be suppressed, leading to a film with good quality. Lower viscosity of the material allows application for a thin and uniform film, whereby the resin layer 101 can be thinner.

Then, the support substrate 61 is heated to polymerize the applied material, whereby the resin layer 101 is formed. At this time, the solvent in the material is removed by the heating. The temperature at this heating is preferably higher than the highest temperature in the process for forming the transistor 110 to be performed later. The temperature is, for example, higher than or equal to 300° C. and lower than or equal to 600° C., preferably higher than or equal to 350° C. and lower than or equal to 550° C., more preferably higher than or equal to 400° C. and lower than or equal to 500° C., and is typically 450° C. For the formation of the resin layer 101, heating at such a temperature is performed in a state where the surface of the resin layer 101 is exposed, so that a gas that can be released from the resin layer 101 can be removed. Thus, release of the gas in the process for forming the transistor 110 can be suppressed.

The thickness of the resin layer 101 is preferably greater than or equal to 0.01 μm and less than 10 μm, more preferably greater than or equal to 0.1 μm and less than or equal to 3 μm, and more preferably greater than or equal to 0.5 μm and less than or equal to 1 μm. The use of a low viscosity solvent facilitates the formation of the thin and uniform resin layer 101.

The thermal expansion coefficient of the resin layer 101 is preferably greater than or equal to 0.1 ppm/° C. and less than or equal to 20 ppm/° C., and more preferably greater than or equal to 0.1 ppm/° C. and less than or equal to 10 ppm/° C. The lower the thermal expansion coefficient of the resin layer 101 is, the more the breakage of the transistor or the like by stress caused by expansion or contraction due to heating can be suppressed.

In the case where an oxide semiconductor film is used as the semiconductor layer 112 in the transistor 110, the semiconductor layer 112 can be formed at a low temperature, so that the resin layer 101 does not need high heat resistance. The heat resistance of the resin layer 101 or the like can be evaluated by, for example, weight loss percentage due to heating, specifically 5% weight loss temperature. The 5% weight loss temperature of the resin layer 101 or the like is lower than or equal to 450° C., preferably lower than or equal to 400° C., more preferably lower than 400° C., more preferably lower than 350° C. In addition, the highest temperature in the process for forming the transistor 110 or the like is preferably lower than or equal to 350° C.

In the case where a photosensitive material is used for the resin layer 101, part of the resin layer 101 can be removed by a photolithography method. Specifically, after the material is applied, heat treatment (also referred to as pre-baking) for removing the solvent is performed, and then light exposure is performed. Next, development is performed, whereby an unnecessary portion can be removed. After that, heat treatment (also referred to as post-baking) is preferably performed. The second heat treatment may be performed at the above-described temperature.

An opening is formed in the resin layer 101 in the above manner, so that a structure described below can be achieved. For example, by disposing a conductive layer to cover the opening, an electrode part of which is exposed on the rear surface side (also referred to as a rear electrode or a through electrode) can be formed after a separation process to be described later. The electrode can be used as an external connection terminal. Furthermore, for example, a structure in which the resin layer 101 is not provided in a marker portion for bonding of two display panels can improve the alignment accuracy.

[Formation of Insulating Layer 131]

Figure 12B:
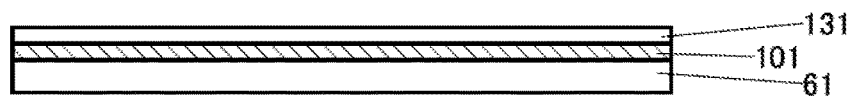

The insulating layer 131 is formed over the resin layer 101 (FIG. 12B).

The insulating layer 131 can be used as a barrier layer that prevents impurities contained in the resin layer 101 from diffusing into a transistor or a light-emitting element to be formed later. Therefore, a material having a high barrier property is preferably used for the insulating layer 131.

For the insulating layer 131, an inorganic insulating material such as a silicon nitride film, a silicon oxynitride film, a silicon oxide film, a silicon nitride oxide film, an aluminum oxide film, or an aluminum nitride film can be used. Two or more of these insulating films may be stacked. In particular, a structure in which a silicon nitride film and a silicon oxide film are stacked on the resin layer 101 side is preferably employed.

In the case where the resin layer 101 has an uneven surface, the insulating layer 131 preferably covers the unevenness. The insulating layer 131 may function as a planarization layer that fills the unevenness. It is preferable to use a stack including an organic insulating material and an inorganic insulating material for the insulating layer 131, for example. The organic insulating material can be an organic resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin.

The insulating layer 131 is preferably formed at a temperature higher than or equal to room temperature and lower than or equal to 400° C., more preferably higher than or equal to 100° C. and lower than or equal to 350° C., more preferably higher than or equal to 150° C. and lower than or equal to 300° C.

[Formation of Transistor]

Figure 12C:
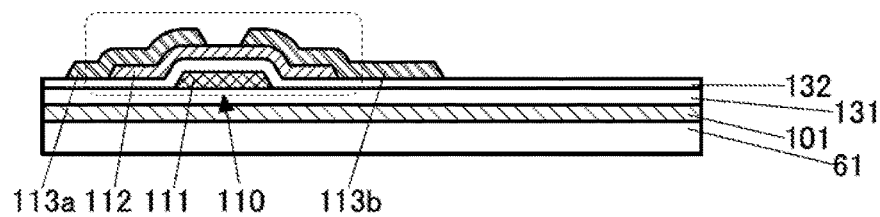

Next, as illustrated in FIG. 12C, the transistor 110 is formed over the insulating layer 131. Here, an example in which a bottom-gate transistor is formed as an example of the transistor 110 will be described.

The conductive layer 111 is formed over the insulating layer 131. The conductive layer 111 can be formed in the following manner: a conductive film is formed, a resist mask is formed, the conductive film is etched, and the resist mask is removed.

Next, the insulating layer 132 is formed. For the insulating layer 132, the description of the inorganic insulating film that can be used as the insulating layer 131 can be referred to.

Then, the semiconductor layer 112 is formed. The semiconductor layer 112 can be formed in the following manner: a semiconductor film is formed, a resist mask is formed, the semiconductor film is etched, and the resist mask is removed.

The semiconductor film is formed at a substrate temperature higher than or equal to room temperature and lower than or equal to 300° C., preferably higher than or equal to room temperature and lower than or equal to 220° C., more preferably higher than or equal to room temperature and lower than or equal to 200° C., more preferably higher than or equal to room temperature and lower than or equal to 170° C. Here, "the substrate temperature for the film formation is room temperature" means that the substrate is not intentionally heated, and includes the case where the substrate temperature is higher than the room temperature because the substrate receives energy in the film formation. The room temperature has a range of, for example, higher than or equal to 10° C. and lower than or equal to 30° C., and is typically 25° C.

It is preferable to use an oxide semiconductor for the semiconductor film. In particular, an oxide semiconductor having a wider band gap than silicon is preferably used. A semiconductor material having a wider band gap and a lower carrier density than silicon is preferably used because off-state current of the transistor can be reduced.

It is preferable to use a material having a band gap of greater than or equal to 2.5 eV, preferably greater than or equal to 2.8 eV, more preferably greater than or equal to 3.0 eV as the oxide semiconductor. With use of such an oxide semiconductor, in light (e.g., laser light) irradiation in the separation process to be described later, the light transmits the semiconductor film and thus electrical characteristics of the transistor are less likely to be adversely affected.

In particular, the semiconductor film used for one embodiment of the present invention is preferably formed under an atmosphere that contains one or both of an inert gas (e.g., Ar) and an oxygen gas by a sputtering method in a state where the substrate is heated.

The substrate temperature for the film formation is preferably higher than or equal to room temperature and lower than or equal to 200° C., more preferably higher than or equal to room temperature and lower than or equal to 170° C. A high substrate temperature results in a larger number of crystal parts with orientation, which electrically stabilize the semiconductor film. A transistor including such a semiconductor film can have high electrical stability. Alternatively, film formation at a low substrate temperature or film formation without intentional substrate heating can make a semiconductor film have a low proportion of crystal parts with orientation and high carrier mobility. A transistor including such a semiconductor film can have high field-effect mobility.

The oxygen flow rate ratio (partial pressure of oxygen) during the film formation is preferably higher than or equal to 0% and lower than 100%, more preferably higher than or equal to 0% and lower than or equal to 50%, more preferably higher than or equal to 0% and lower than or equal to 33%, and more preferably higher than or equal to 0% and lower than or equal to 15%. A low oxygen flow rate can result in a semiconductor film with high carrier mobility, leading to a transistor with high field-effect mobility.

Setting the substrate temperature and the oxygen flow rate during the film formation within the above ranges can result in a semiconductor film containing both crystal parts with orientation and crystal parts with no orientation. Furthermore, the proportions of crystal parts with orientation and crystal parts with no orientation can be adjusted by optimization of the substrate temperature and the oxygen flow rate within the above ranges.

An oxide target that can be used for forming the semiconductor film is not limited to an In—Ga—Zn-based oxide; for example, an In-M-Zn-based oxide (M is Al, Y, or Sn) can be used.

When a semiconductor film containing crystal parts is formed using a sputtering target containing a polycrystalline oxide having a plurality of crystal grains, a semiconductor film with crystallinity can be obtained easier than the case of using a sputtering target not containing a polycrystalline oxide.

In particular, a transistor including a semiconductor film that contains both crystal parts with orientation in a thickness direction (also referred to as a film surface direction, or a direction perpendicular to a formation surface or surface of a film) and randomly aligned crystal parts with no such orientation can have more stable electrical characteristics and a smaller channel length, for example. On the other hand, a transistor including a semiconductor film that contains only crystal parts with no orientation can have high field-effect mobility. Note that as described below, a reduction in oxygen vacancies in an oxide semiconductor can achieve a transistor with high field-effect mobility and high stability of electrical characteristics.

In the case of using the oxide semiconductor film as described above, high-temperature heat treatment and a laser crystallization process which are needed for LTPS are unnecessary; thus, the semiconductor layer 112 can be formed at a significantly low temperature. Therefore, the resin layer 101 can be formed thin.

Then, the conductive layer 113*a* and the conductive layer 113*b* are formed. The conductive layers 113*a* and 113*b* can be formed in the following manner: a conductive film is formed, a resist mask is formed, the conductive film is etched, and the resist mask is removed.

Note that during the processing of the conductive layers 113*a* and 113*b*, the semiconductor layer 112 might be partly etched to be thin in a region not covered with the resist mask. An oxide semiconductor film containing crystal parts with orientation is preferable for the semiconductor layer 112 because the unintended etching can be prevented.

In the above manner, the transistor 110 can be fabricated. The transistor 110 contains an oxide semiconductor in the semiconductor layer 112 where a channel is formed. In the transistor 110, part of the conductive layer 111 functions as a gate, part of the insulating layer 132 functions as a gate insulating layer, and the conductive layer 113a and the conductive layer 113b function as a source and a drain.

[Formation of Insulating Layer 133]

Next, the insulating layer 133 that covers the transistor 110 is formed. The insulating layer 133 can be formed in a manner similar to that of the insulating layer 132.

The insulating layer 133 is preferably formed at a temperature higher than or equal to room temperature and lower than or equal to 400° C., more preferably higher than or equal to 100° C. and lower than or equal to 350° C., more preferably higher than or equal to 150° C. and lower than or equal to 300° C. Higher temperatures can provide the insulating film with higher density and a higher barrier property.

It is preferable to use an oxide insulating film, such as a silicon oxide film or a silicon oxynitride film, formed at a low temperature in the above range under an atmosphere containing oxygen for the insulating layer 133. An insulating film with low oxygen diffusibility and low oxygen permeability, such as a silicon nitride film, is preferably stacked over the silicon oxide film or the silicon oxynitride film. The oxide insulating film formed at low temperatures under an atmosphere containing oxygen can easily release a large amount of oxygen by heating. When a stack including such an oxide insulating film that releases oxygen and an insulating film with low oxygen diffusibility and low oxygen permeability is heated, oxygen can be supplied to the semiconductor layer 112. As a result, oxygen vacancies in the semiconductor layer 112 can be filled and defects at the interface between the semiconductor layer 112 and the insulating layer 133 can be repaired, leading to a reduction in defect levels. Accordingly, an extremely highly reliable semiconductor device can be fabricated.

Through the above steps, the transistor 110 and the insulating layer 133 covering the transistor 110 can be formed over the flexible resin layer 101. If the resin layer 101 and the support substrate 61 are separated from each other at this stage by a method described later, a flexible device including no display element can be fabricated. Forming the transistor 110 or forming a capacitor, a resistor, a wiring, and the like in addition to the transistor 110 can provide a flexible device including a semiconductor circuit, for example.

[Formation of Insulating Layer 134]

Then, the insulating layer 134 is formed over the insulating layer 133. The display element is formed on the insulating layer 134 in a later step; thus, the insulating layer 134 preferably functions as a planarization layer. For the insulating layer 134, the description of the organic insulating film or the inorganic insulating film that can be used for the insulating layer 131 can be referred to.

For the insulating layer 134, as well as for the resin layer 101, a photosensitive and thermosetting resin material is preferably used. In particular, the same material is preferably used for the insulating layer 134 and the resin layer 101. In that case, the same material and apparatus can be used for forming the insulating layer 134 and the resin layer 101.

The thickness of the insulating layer 134, as well as the thickness of the resin layer 101, is preferably greater than or equal to 0.01 µm and less than 10 µm, more preferably greater than or equal to 0.1 µm and less than or equal to 3 µm, and more preferably greater than or equal to 0.5 µm and less than or equal to 1 µm. The use of a low viscosity solvent facilitates the formation of the thin and uniform insulating layer 134.

[Formation of Light-Emitting Element 120]

Next, openings that reach the conductive layer 113b and the like are formed in the insulating layer 134 and the insulating layer 133.

After that, a conductive layer 121 is formed. Part of the conductive layer 121 functions as a pixel electrode. The conductive layer 121 can be formed in the following manner: a conductive film is formed, a resist mask is formed, the conductive film is etched, and the resist mask is removed.

Figure 12D:
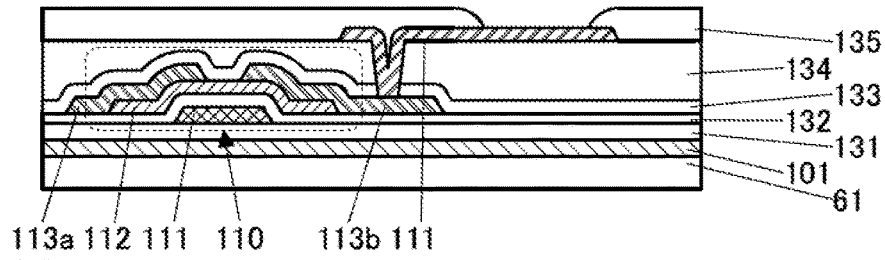

Subsequently, the insulating layer 135 that covers an end portion of the conductive layer 121 is formed as illustrated in FIG. 12D. For the insulating layer 135, the description of the organic insulating film or the inorganic insulating film that can be used for the insulating layer 131 can be referred to.

For the insulating layer 135, as well as for the resin layer 101, a photosensitive and thermosetting resin material is preferably used. In particular, the same material is preferably used for the insulating layer 135 and the resin layer 101. In that case, the same material and apparatus can be used for forming the insulating layer 135 and the resin layer 101.

The thickness of the insulating layer 135, as well as the thickness of the resin layer 101, is preferably greater than or equal to 0.01 µm and less than 10 µm, more preferably greater than or equal to 0.1 µm and less than or equal to 3 µm, and more preferably greater than or equal to 0.5 µm and less than or equal to 1 µm. The use of a low viscosity solvent facilitates the formation of the thin and uniform insulating layer 135.

Figure 12E:
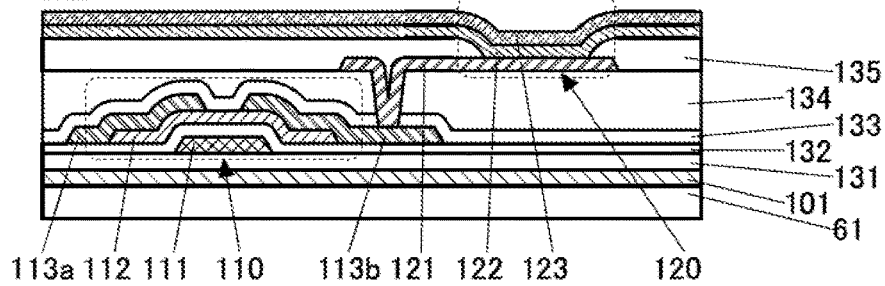

Next, the EL layer 122 and the conductive layer 123 are formed as illustrated in FIG. 12E.

The EL layer 122 can be formed by an evaporation method, a coating method, a printing method, a discharge method, or the like. In the case where the EL layer 122 is formed for each individual pixel, an evaporation method using a shadow mask such as a metal mask, an ink-jet method, or the like can be used. In the case of sharing the EL layer 122 by some pixels, an evaporation method not using a metal mask can be used. Here, an example in which the EL layer 122 is formed by an evaporation method without using a metal mask is described.

The conductive layer 123 can be formed by an evaporation method, a sputtering method, or the like.

In the above manner, the light-emitting element 120 can be completed. In the light-emitting element 120, the conductive layer 121 part of which functions as a pixel electrode, the EL layer 122, and the conductive layer 123 part of which functions as a common electrode are stacked.

[Formation of Light Absorption Layer 103a]

A support substrate 62 is prepared. For the support substrate 62, the description of the support substrate 61 can be referred to.

Figure 13A:
FIGS. 13A to 13E are cross-sectional views illustrating an example of a manufacturing method of a display device.

A light absorption layer 103a is formed over the support substrate 62 (FIG. 13A). The light absorption layer 103a releases hydrogen, oxygen, or the like by absorbing light 70 and generating heat in a light 70 irradiation step to be performed later.

As the light absorption layer 103a, for example, a hydrogenated amorphous silicon (a-Si:H) film from which hydrogen is released by heating can be used. The hydrogenated amorphous silicon film can be formed by, for example, a plasma CVD method using a deposition gas containing $SiH_4$. Furthermore, after the deposition, heat treatment may be performed under an atmosphere containing hydrogen in order that the light absorption layer 103a contains a larger amount of hydrogen.

Alternatively, as the light absorption layer 103a, an oxide film from which oxygen is released by heating can be used.

In particular, an oxide semiconductor film or an oxide semiconductor film having an impurity state (also referred to as an oxide conductor film) is preferred because they have a narrower band gap and are more likely to absorb light than an insulating film such as a silicon oxide film. In the case where an oxide semiconductor is used for the light absorption layer 103a, the above-described method for forming the semiconductor layer 112 and a material to be described later which can be used for the semiconductor layer can be employed. The oxide film can be formed by a plasma CVD method, a sputtering method, or the like under an atmosphere containing oxygen, for example. In particular, in the case where an oxide semiconductor film is used, a sputtering method under an atmosphere containing oxygen is preferred. Furthermore, after the deposition, heat treatment may be performed under an atmosphere containing oxygen in order that the light absorption layer 103a contains a larger amount of oxygen.

Alternatively, the oxide film that can be used as the light absorption layer 103a may be an oxide insulating film. For example, a silicon oxide film, a silicon oxynitride film, an aluminum oxide film, or an aluminum oxynitride film can be used. For example, such an oxide insulating film is formed under an atmosphere containing oxygen at a low temperature (e.g., lower than or equal to 250° C., preferably lower than or equal to 220° C.), whereby an oxide insulating film containing excess oxygen can be formed. This oxide insulating film can be formed by, for example, a sputtering method or a plasma CVD method.

[Formation of Resin Layer 102]

Figure 13B:
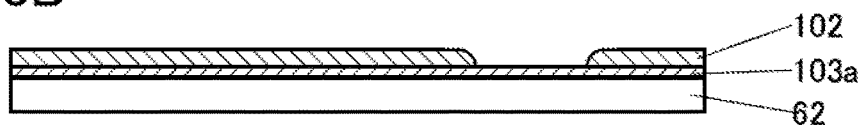

Next, the resin layer 102 having an opening is formed over the light absorption layer 103a (FIG. 13B). The description of the method and the material for forming the resin layer 101 can be referred to for those for forming the resin layer 102 except for the opening of the resin layer 102.

In order to form the resin layer 102, first, a photosensitive material is applied on the light absorption layer 103a to form a thin film, and pre-baking is performed. Next, the material is exposed to light with use of a photomask, and then developed, whereby the resin layer 102 having an opening can be formed. After that, post-baking is performed to sufficiently polymerize the material and remove a gas in the film.

[Formation of Insulating Layer 141]

Figure 13C:
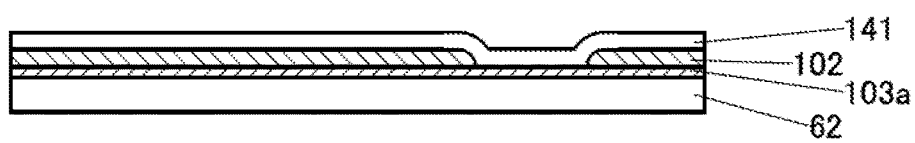

Next, the insulating layer 141 is formed to cover the resin layer 102 and the opening of the resin layer 102 (FIG. 13C). Part of the insulating layer 141 is in contact with the light absorption layer 103a. The insulating layer 141 can be used as a barrier layer that prevents impurities contained in the resin layer 102 from diffusing into a transistor or a light-emitting element to be formed later. Therefore, a material having a high barrier property is preferably used for the insulating layer 141.

The description of the method and the material for forming the insulating layer 131 can be referred to for those for forming the insulating layer 141.

[Formation of Light-Blocking Layer and Coloring Layer]

Figure 13D:
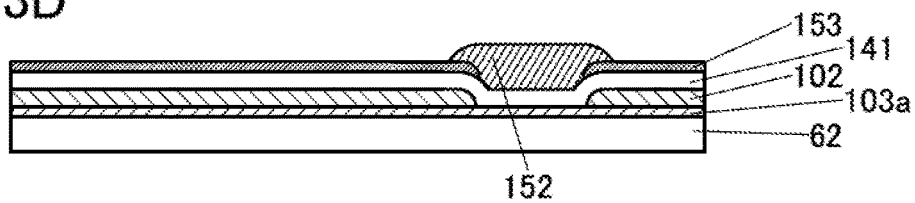

Next, the light-blocking layer 153 and the coloring layer 152 are formed over the insulating layer 141 (FIG. 13D).

For the light-blocking layer 153, a metal material or a resin material can be used. In the case where a metal material is employed, the light-blocking layer 153 can be formed in such a manner that a conductive film is formed and an unnecessary portion is removed by a photolithography method or the like. In the case where a metal material or a photosensitive resin material containing pigment or dye is used, the light-blocking layer 153 can be formed by a photolithography method or the like.

For the coloring layer 152, a photosensitive material can be used. The coloring layer 152 formed with a photosensitive material can be processed into an island-like shape by a photolithography method or the like.

Through the above steps, the insulating layer 141, the light-blocking layer 153, and the coloring layer 152 can be formed over the resin layer 102. Note that a manufacturing process for the resin layer 101 side and a manufacturing process for the resin layer 102 side can be independently performed, and the order is not particularly limited. Alternatively, these two processes may be performed in parallel.

[Bonding]

Figure 13E:
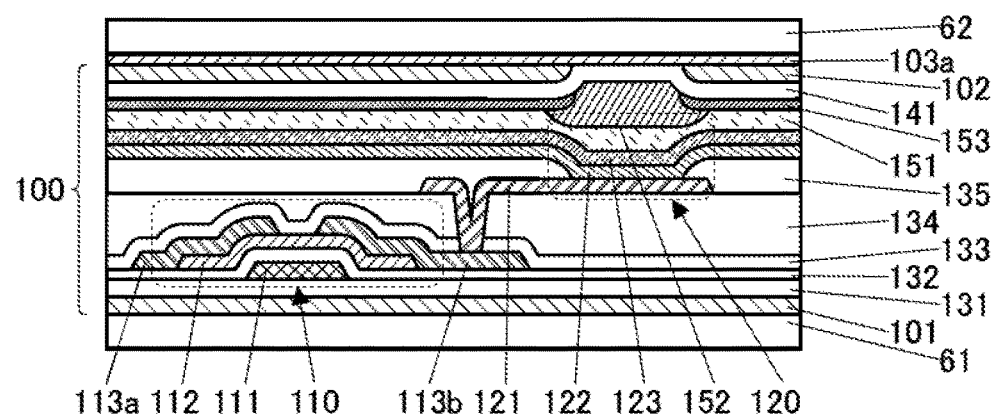

Next, as illustrated in FIG. 13E, the support substrate 61 and the support substrate 62 are bonded to each other with use of the adhesive layer 151. The bonding is performed in such that the opening of the resin layer 102 overlaps with the light-emitting element 120. Then, the adhesive layer 151 is cured. Thus, the light-emitting element 120 can be sealed by the adhesive layer 151.

A curable material is preferably used for the adhesive layer 151. For example, a photocurable resin, a reactive curable resin, or a thermosetting resin can be used. In particular, a resin material without a solvent is preferably used.

Through the above steps, the display panel 100 can be fabricated. At the point of FIG. 13E, the display panel 100 is interposed by the support substrate 61 and the support substrate 62.

[Formation of Light-Absorbing Layer 103b]

A support substrate 63 is prepared and a light-absorbing layer 103b is formed over the support substrate 63. The description of the support substrate 61 can be referred to for the support substrate 63.

The light-absorbing layer 103b can be formed using a material and a method similar to those of the light-absorbing layer 103a.

[Formation of Resin Layer 201]

Next, the resin layer 201 having an opening is formed over the light-absorbing layer 103b. The description of the method and the material for forming the resin layer 102 can be referred to for those for forming the resin layer 201.

[Formation of Insulating Layer 231]

Figure 14A:
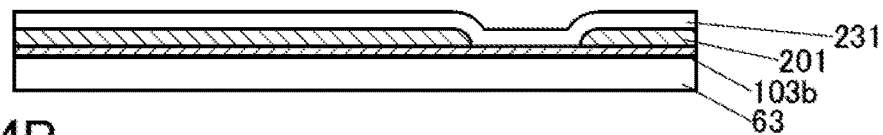
FIGS. 14A to 14F are cross-sectional views illustrating an example of a manufacturing method of a display device.

Next, the insulating layer 231 is formed to cover the resin layer 201 and the opening of the resin layer 201 (FIG. 14A). The description of the method and the material for forming the insulating layer 131 can be referred to for those for forming the insulating layer 231.

[Formation of Transistor 210]

Figure 14B:
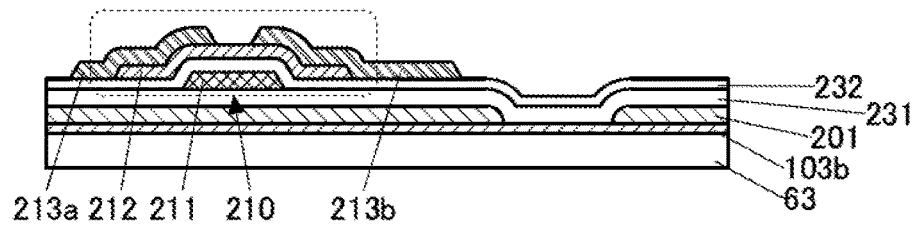

Next, as illustrated in FIG. 14B, the transistor 210 is formed over the insulating layer 231.

The transistor 210 is formed by forming the conductive layer 211, the insulating layer 231, the semiconductor layer 212, and the conductive layers 213a and 213b in this order. The formation method of the transistor 110 can be referred to for the formation method of each layer.

The transistor 210 contains an oxide semiconductor in the semiconductor layer 212 where a channel is formed. In the transistor 210, part of the conductive layer 211 functions as a gate, part of the insulating layer 232 functions as a gate insulating layer, and the conductive layers 213a and 213b function as a source and a drain.

[Formation of Conductive Layer 221 and Alignment Film 224a]

Next, an opening that reaches the conductive layer 213b is formed in the insulating layer 234 and the insulating layer 233.

After that, the conductive layer 221 is formed. Part of the conductive layer 221 functions as a pixel electrode. The conductive layer 221 can be formed in the following manner: a conductive film is formed, a resist mask is formed, the conductive film is etched, and the resist mask is removed.

Figure 14C:
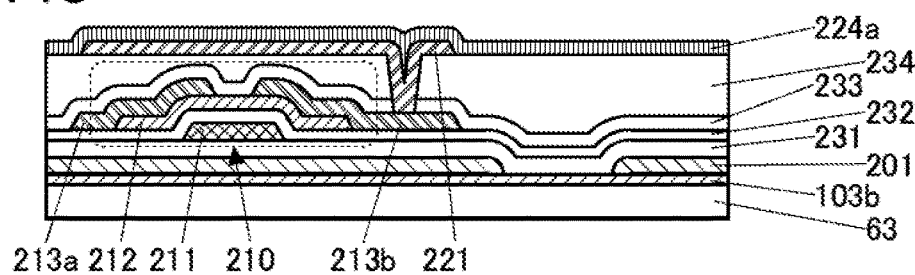

Next, as illustrated in FIG. 14C, the alignment film 224a is formed over the conductive layer 221 and the insulating layer 234. The alignment film 224a can be formed by performing rubbing treatment after a thin film of a resin or the like is formed.

Through the above steps, the transistor 210, the conductive layer 221, the alignment film 224a, and the like can be formed over the resin layer 201.

[Formation of Light-Absorbing Layer 103c]

A support substrate 64 is prepared and a light-absorbing layer 103c is formed over the support substrate 64. The description of the support substrate 61 can be referred to for the support substrate 64.

The light-absorbing layer 103c can be formed using a material and a method similar to those of the light-absorbing layer 103a.

[Formation of Resin Layer 202]

Next, the resin layer 202 having an opening is formed over the light-absorbing layer 103c. The description of the method and the material for forming the resin layer 101 can be referred to for those for forming the resin layer 202.

[Formation of Insulating Layer 204]

Figure 14D:
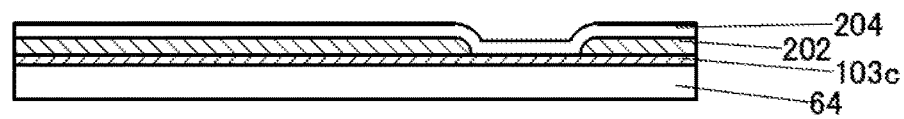

Next, the insulating layer 204 is formed to cover the resin layer 202 and the opening of the resin layer 202 (FIG. 14D). The description of the method and the material for forming the insulating layer 131 can be referred to for those for forming the insulating layer 204.

[Formation of Conductive Layer 223 and Alignment Film 224b]

Next, the conductive layer 223 is formed over the insulating layer 204. The conductive layer 223 can be formed by forming a conductive film. Note that the conductive layer 223 may be formed by, for example, a sputtering method using a shadow mask such as a metal mask such that the conductive layer 223 is not provided in the peripheral portion of the resin layer 202. Alternatively, the conductive layer 223 may be formed by forming a conductive film, performing patterning by a photolithography method, and removing an unnecessary portion of the conductive film by etching.

Figure 14E:
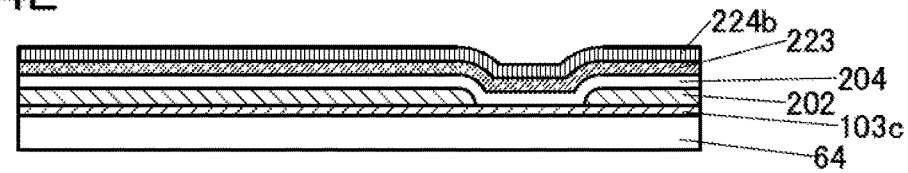

Next, the alignment film 224b is formed over the conductive layer 223 (see FIG. 14E). The alignment film 224b can be formed by a method similar to that of the alignment film 224a.

Through the above steps, the insulating layer 204, the conductive layer 223, and the alignment film 224b can be formed over the resin layer 202. Note that a manufacturing process for the resin layer 201 side and a manufacturing process for the resin layer 202 side can be independently performed, and the order is not particularly limited. Alternatively, these two processes may be performed in parallel.

[Bonding]

Figure 14F:
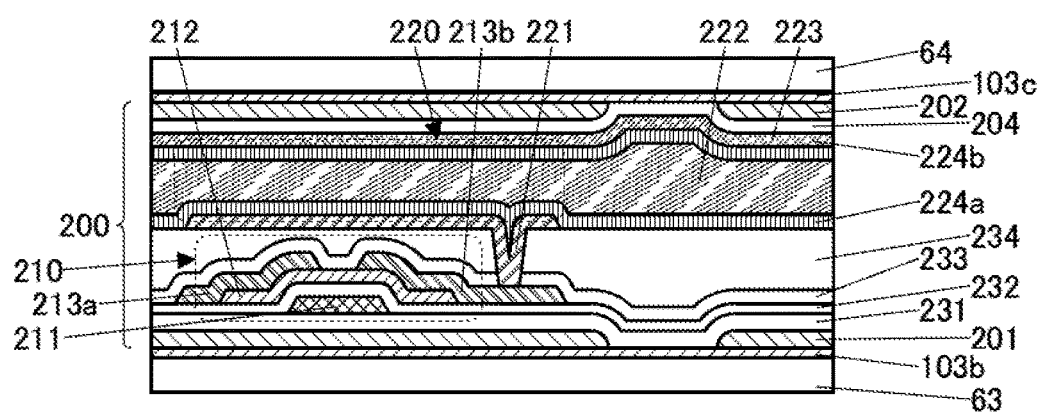

Next, as illustrated in FIG. 14F, the support substrate 63 and the support substrate 64 are bonded to each other with the liquid crystal 222 interposed therebetween. At this time, the support substrates are bonded to each other such that the opening of the resin layer 201 and the opening of the resin layer 202 overlap with each other. In addition, the resin layer 201 and the resin layer 202 are bonded with an adhesive layer (not illustrated) in the peripheral portion.

Next, an adhesive layer (not illustrated) for bonding the resin layer 201 and the resin layer 202 is formed on one or both of the resin layer 201 and the resin layer 202. The adhesive layer is formed to surround a region where a pixel is provided. The adhesive layer can be formed by a screen printing method, a dispensing method, or the like. For the adhesive layer, a thermosetting resin, an ultraviolet curable resin, or the like can be used. Alternatively, a resin which is cured when heated after pre-cured by ultraviolet light or the like may be used. Alternatively, a thermosetting and ultraviolet curable resin or the like may be used as the adhesive layer.

Next, the liquid crystal 222 is dropped in a region surrounded by the adhesive layer by a dispensing method or the like. Then, the support substrate 63 and the support substrate 64 are bonded to each other such that the liquid crystal 222 is interposed therebetween, and the adhesive layer is cured. The bonding is preferably performed in a reduced-pressure atmosphere because air bubbles and the like can be prevented from entering between the support substrate 63 and the support substrate 64.

In addition, after the liquid crystal 222 is dropped, a particulate gap spacer may be dispersed in a region where the pixel is provided or outside the region, or the liquid crystal 222 containing the gap spacer may be dropped in a region where the pixel is provided or outside the region. The liquid crystal 222 may be injected in a reduced-pressure atmosphere through a space provided in the adhesive layer after the support substrate 63 and the support substrate 64 are bonded to each other.

Through the above steps, the display panel 200 can be fabricated. At the point of FIG. 14F, the display panel 200 is interposed by the support substrate 63 and the support substrate 64.

[Separation of Support Substrate 62]

Next, as illustrated in FIG. 15A, the light-absorbing layer 103a is irradiated with the light 70 through the support substrate 62 from the support substrate 62 side of the display panel 100.

Laser light is suitable for the light 70. In particular, linear laser light is preferable.

Note that a flash lamp or the like may be used as long as the light-absorbing layer 103a can be irradiated with light whose energy is as high as that of laser light.

As the light 70, light having a wavelength by which at least part of the light 70 is transmitted through the support substrate 62 and absorbed by the light-absorbing layer 103a is selected. Light having a wavelength which is absorbed by the resin layer 102 is preferably used as the light 70. In particular, it is preferable to use light with a wavelength range from visible light to ultraviolet light as the light 70. For example, light having a wavelength of greater than or equal to 200 nm and less than or equal to 400 nm, preferably greater than or equal to 250 nm and less than or equal to 350 nm, is used. In particular, an excimer laser having a wavelength of 308 nm is preferably used because the productivity is increased. The excimer laser is preferable because the excimer laser can be used also for laser crystallization of LTPS, so that the existing LTPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. Further alternatively, a pulsed laser such as a picosecond laser may be used.

In the case where a linear laser light is used as the light 70, the light 70 is scanned and a region to be peeled is entirely irradiated with the light 70 by relatively moving the support substrate 61 and a light source. At this step, when irradiation is performed on the entire surface where the resin layer 102 is provided, the resin layer 102 can be peeled entirely and it is not necessary to cut the periphery portion of the support substrate 62 by scribing or the like in a subsequent separation step. Alternatively, it is preferable that the peripheral portion of the region where the resin layer 102 is provided have a region not irradiated with the light 70 because separation of the resin layer 102 and the support substrate 62 can be suppressed at the irradiation.

By the irradiation with the light 70, the light-absorbing layer 103a is heated and hydrogen, oxygen, or the like is released from the light-absorbing layer 103a. At this time, hydrogen, oxygen, or the like is released in a gaseous state. The released gas remains near the interface between the light-absorbing layer 103a and the resin layer 102 or near the interface between the light-absorbing layer 103a and the support substrate 62; thus, the force of peeling them occurs. Consequently, adhesion between the light-absorbing layer 103a and the resin layer 102 or adhesion between the light-absorbing layer 103a and the support substrate 62 is reduced and a state where peeling is easily performed can be formed.

Part of the gas released from the light-absorbing layer 103a remains in the light-absorbing layer 103a in some cases. Therefore, in some cases, the light-absorbing layer 103a is embrittled and separation is likely to occur inside the light-absorbing layer 103a.

Moreover, in the case where a film releasing oxygen is used as the light-absorbing layer 103a, part of the resin layer 102 is oxidized and embrittled in some cases by oxygen released from the light-absorbing layer 103a. Accordingly, a state where peeling is easily performed can be formed at the interface between the resin layer 102 and the light-absorbing layer 103a.

Also in a region overlapping with the opening of the resin layer 102, adhesion at the interface between the light-absorbing layer 103a and the insulating layer 141 or adhesion at the interface between the light-absorbing layer 103a and the support substrate 62 is reduced and a state where peeling is easily performed is formed for the same reason as above. In some cases, the light-absorbing layer 103a is embrittled and a state where separation is likely to occur.

In contrast, the region not irradiated with the light 70 still has high adhesion.

Here, in the case where an oxide semiconductor film is used for each of the light-absorbing layer 103a and the semiconductor layer 112, light having a wavelength which can be absorbed by the oxide semiconductor film is used as the light 70. However, the light-absorbing layer 103a and the resin layer 102 are stacked above the transistor 110. Furthermore, the resin layer 102 on which heat treatment is performed sufficiently tends to absorb more light than the oxide semiconductor film and can absorb light sufficiently even with a small thickness. Therefore, even when part of the light 70 is not absorbed by the light-absorbing layer 103a and transmitted, the part of the light 70 is absorbed by the resin layer 102 and reaching of the light to the semiconductor layer 112 is suppressed. Consequently, the electrical characteristics of the transistor 110 are hardly changed.

Next, the support substrate 62 and the resin layer 102 are separated (FIG. 15B1).

Separation can be performed by applying pulling force in the perpendicular direction to the support substrate 62 while the support substrate 61 is fixed to a stage. For example, the support substrate 62 can be separated by adsorbing part of the top surface of the support substrate 62 and pulling it upward. The stage may have any structure as long as the support substrate 61 can be fixed. For example, the stage may have an adsorption mechanism capable of vacuum adsorption, electrostatic adsorption, or the like or a mechanism physically fastening the support substrate 61.

Alternatively, separation may be performed by pressing a drum-shaped member with an adhesive surface against the top surface of the support substrate 62 and rotating the member. At this time, the stage may be moved in the peeling direction.

In the case where the region not irradiated with the light 70 is provided in the peripheral portion of the resin layer 102, a notch may be formed in part of the resin layer 102 irradiated with the light 70 to serve as a trigger for peeling. The notch can be formed with a sharp edged tool or a needle-like member or can be formed by cutting the support substrate 62 and the resin layer 102 at the same time by scribing or the like.

FIG. 15B1 illustrates an example in which separation occurs at the interface between the light-absorbing layer 103a and the resin layer 102 and the interface between the light-absorbing layer 103a and the insulating layer 141.

Figure 2:
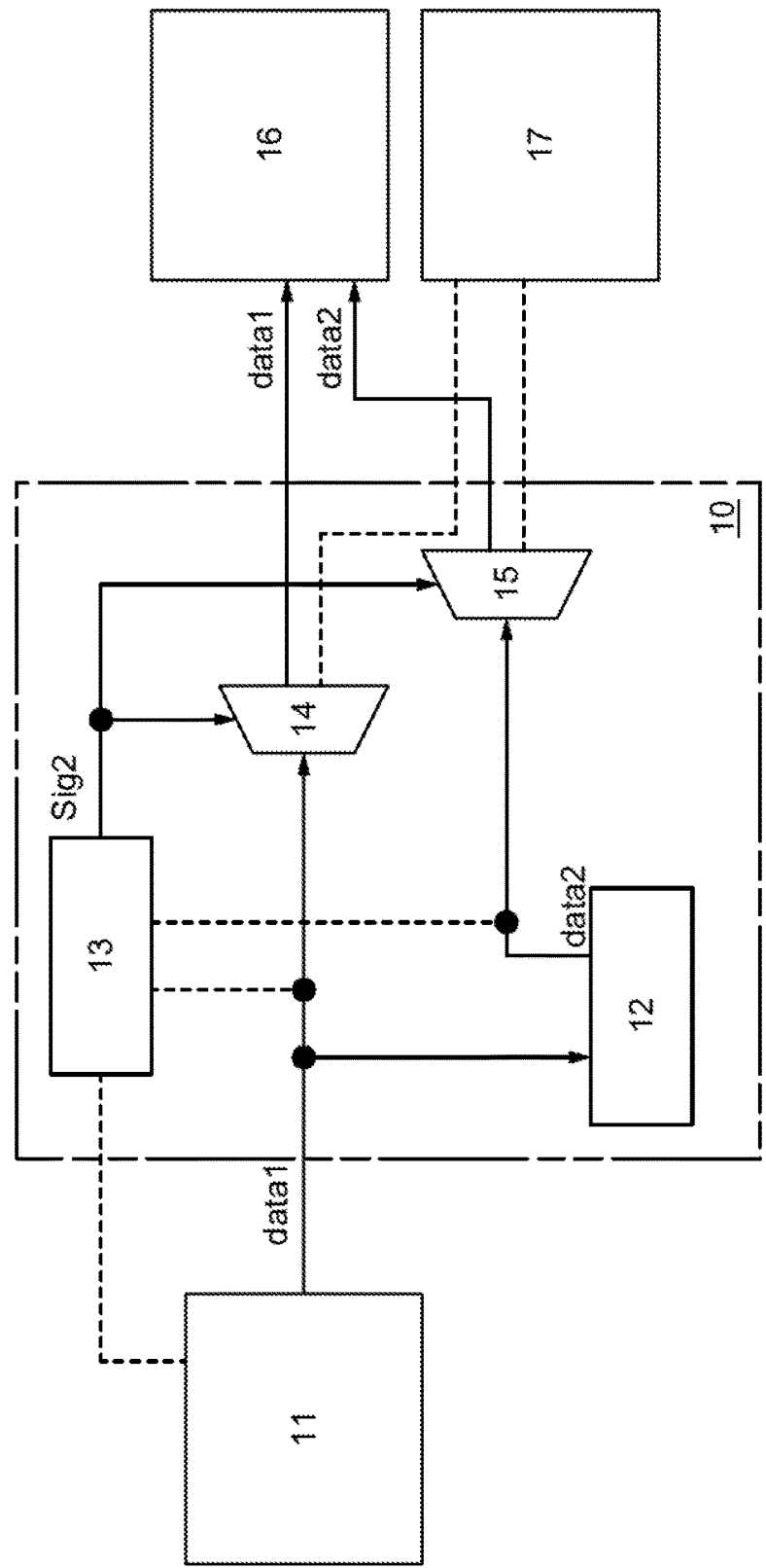
FIG. 2 is a block diagram illustrating an operation example of a semiconductor device of one embodiment of the present invention.
Figure 3:
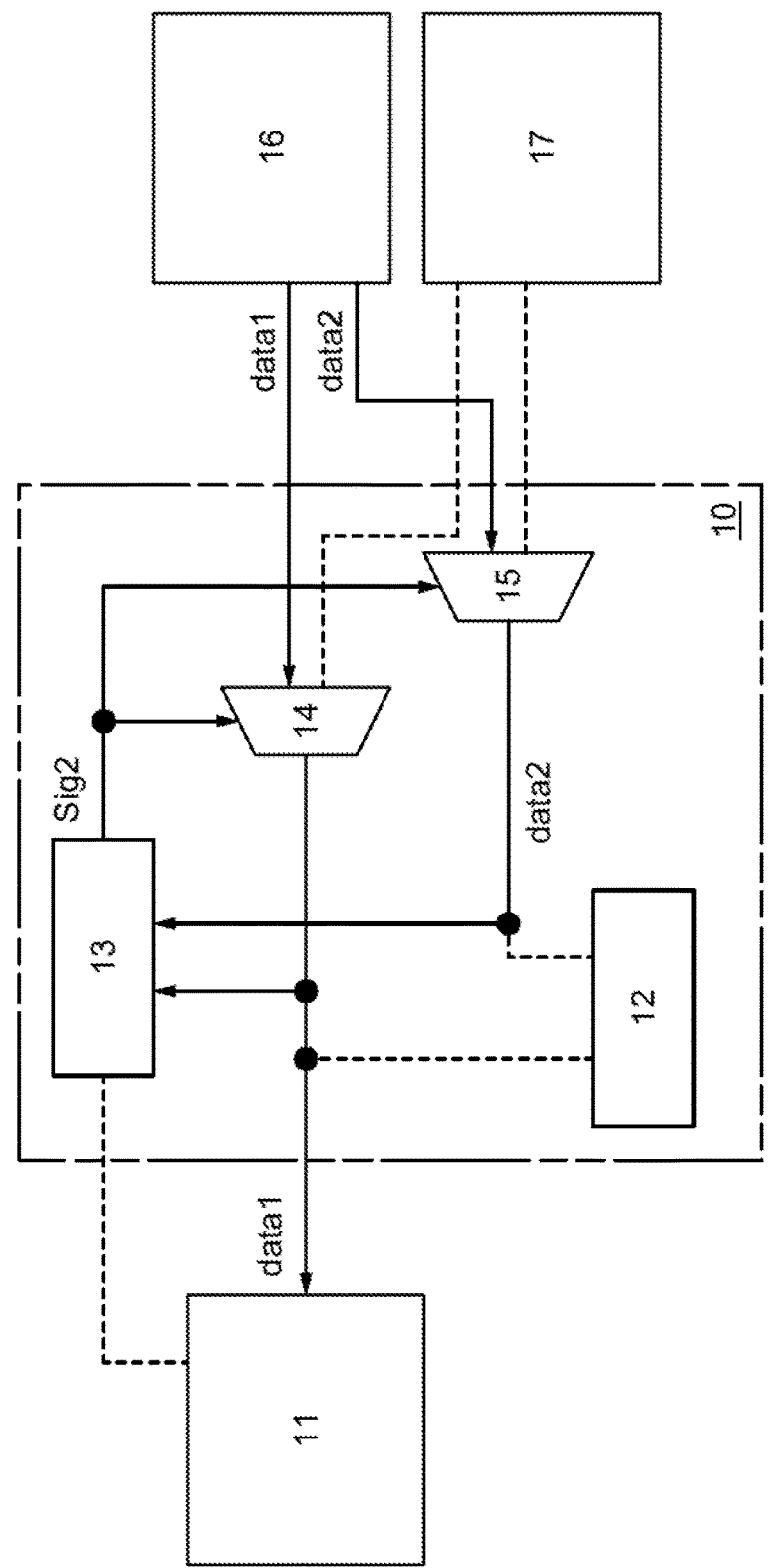
FIG. 3 is a block diagram illustrating an operation example of a semiconductor device of one embodiment of the present invention.
Figure 4:
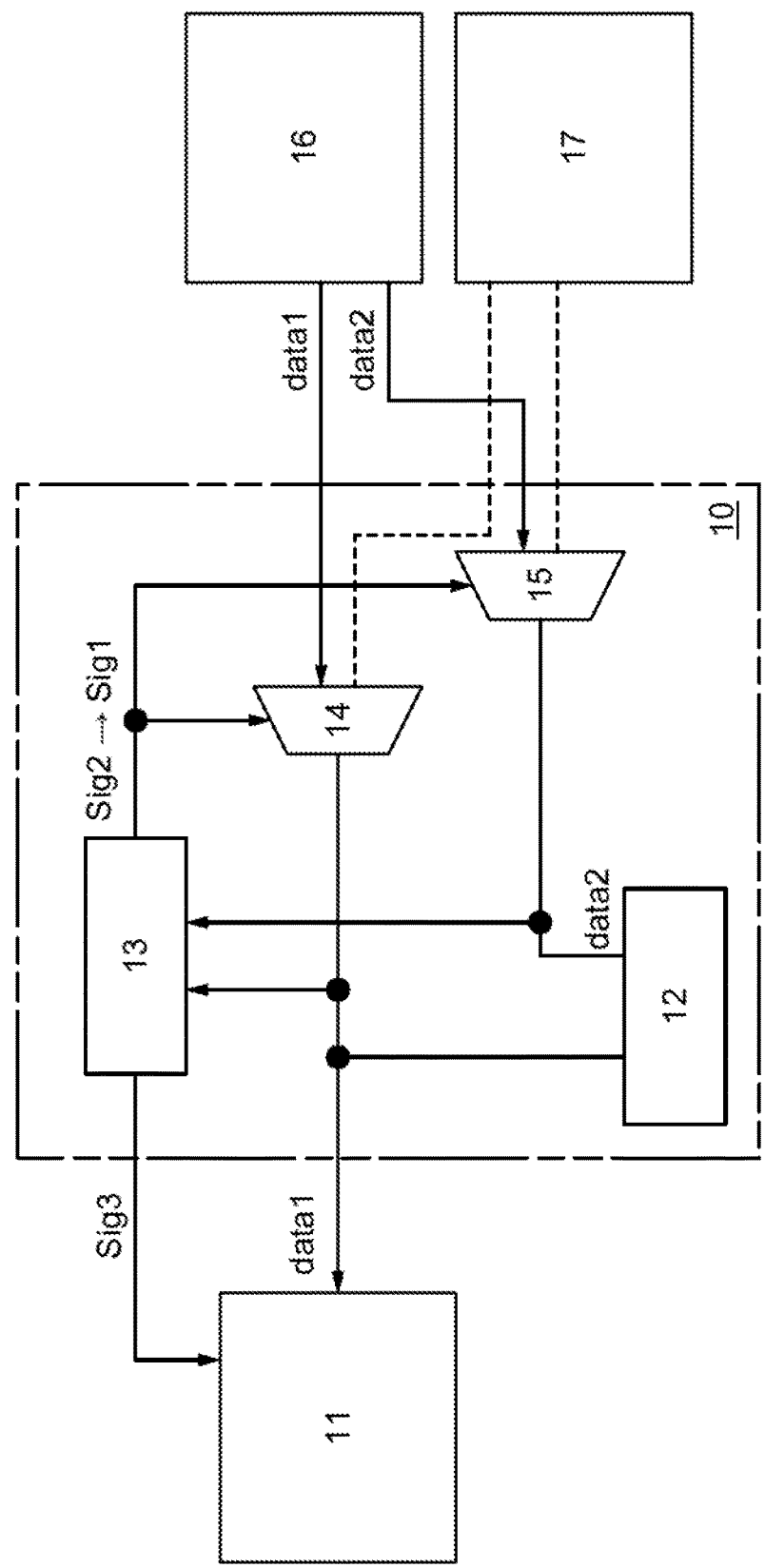
FIG. 4 is a block diagram illustrating an operation example of a semiconductor device of one embodiment of the present invention.
Figure 5:
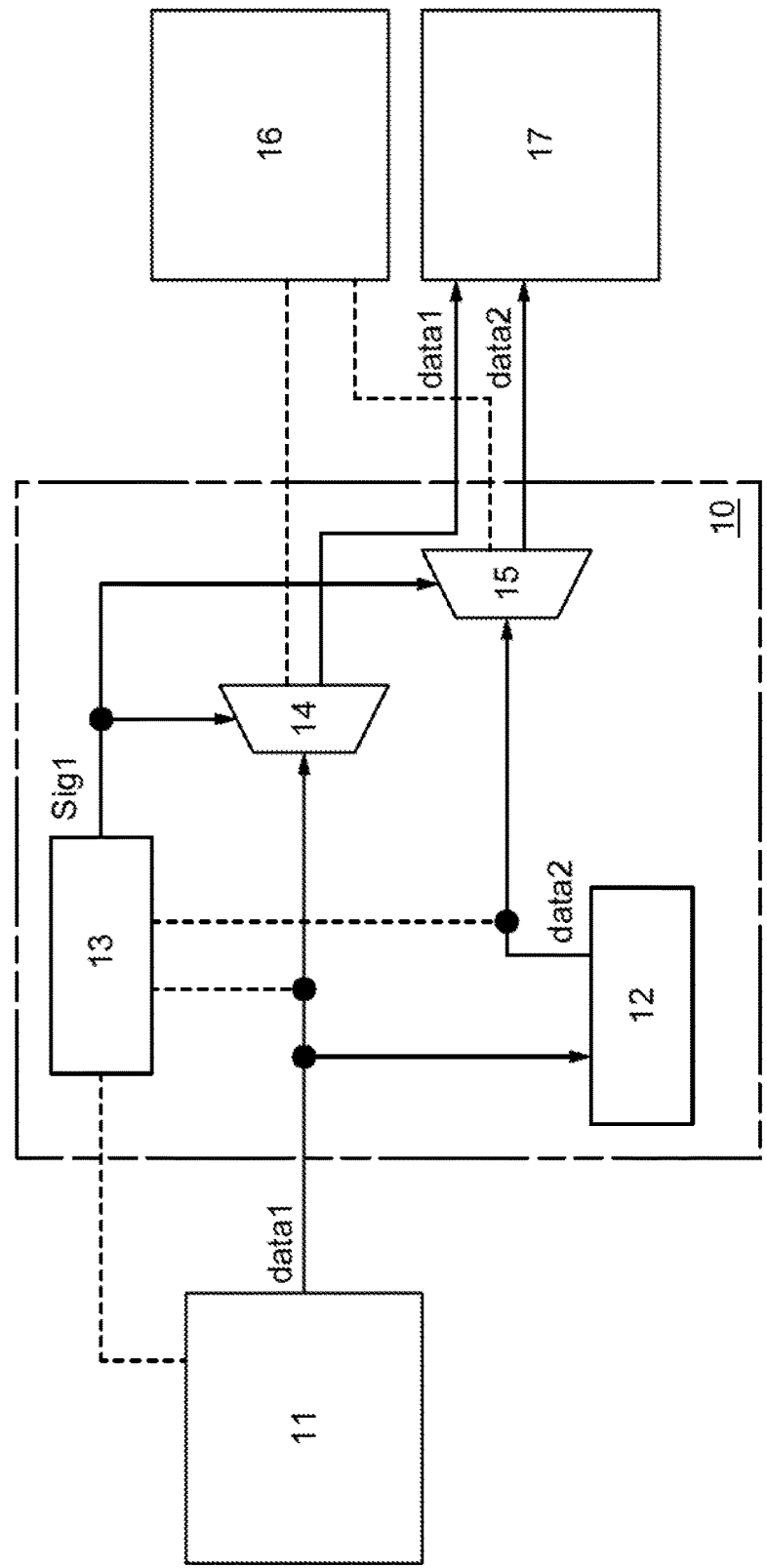
FIG. 5 is a block diagram illustrating an operation example of a semiconductor device of one embodiment of the present invention.
Figure 6:
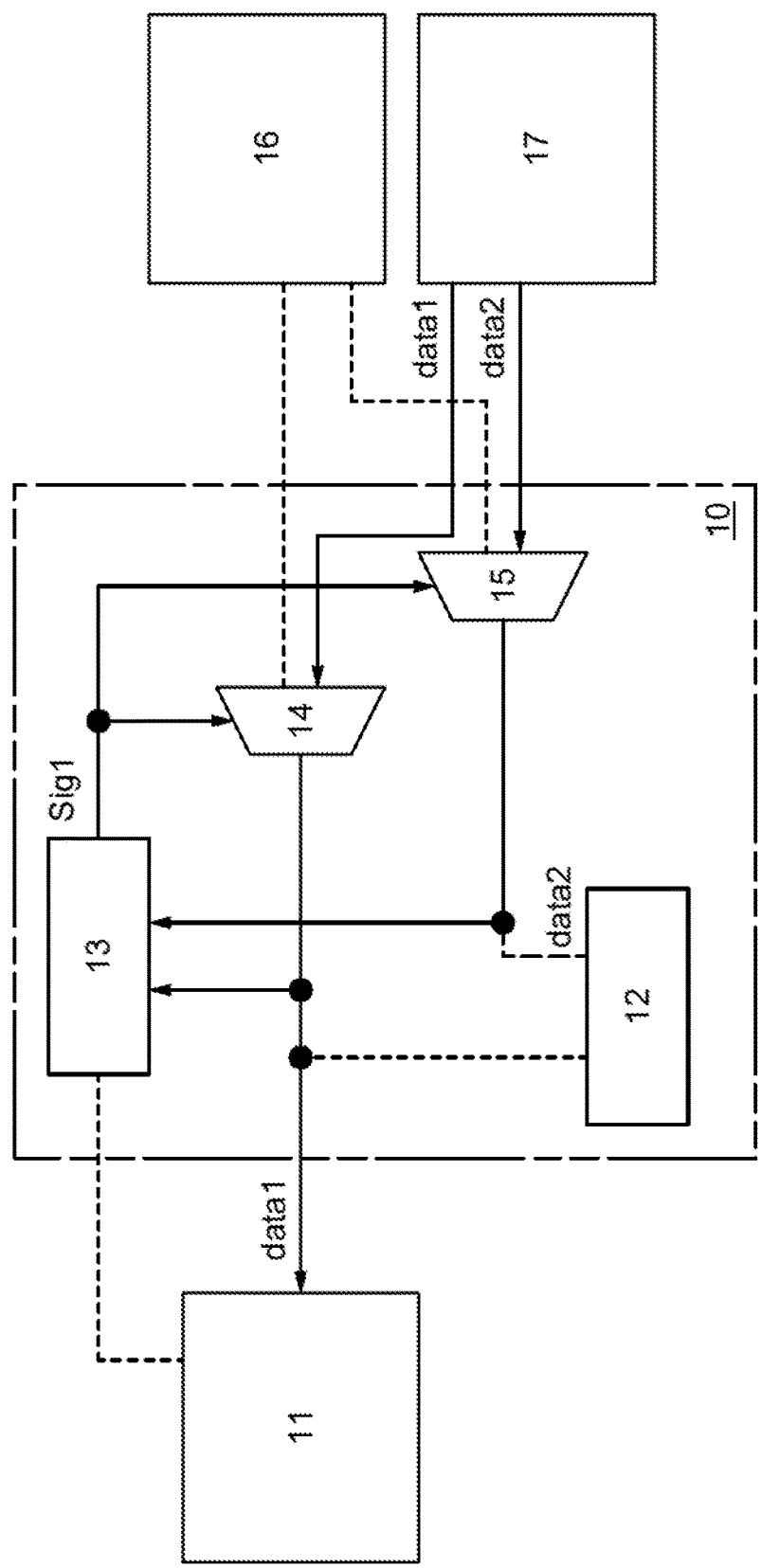
FIG. 6 is a block diagram illustrating an operation example of a semiconductor device of one embodiment of the present invention.

FIG. 15B2 illustrates an example in which a light-absorbing layer 103aa which is part of the light-absorbing layer 103a remains on the surfaces of the resin layer 102 and the insulating layer 141. For example, this example corresponds to the case where separation (fracture) occurs inside the light-absorbing layer 103a. In the case where separation occurs at the interface between the light-absorbing layer 103a and the support substrate 62, the light-absorbing layer 103a entirely remains on the resin layer 102 and the insulating layer 141 in some cases.

The light-absorbing layer 103aa (or the light-absorbing layer 103a) is preferably removed when remains in this manner. Although the light-absorbing layer 103aa can be removed by a dry etching method, a wet etching method, a sandblast method, or the like, it is particularly preferable to employ a dry etching method. Note that in removing the light-absorbing layer 103aa, part of the resin layer 102 and part of the insulating layer 141 are thinned by etching in some cases.

In the case where a light-transmitting insulating material is used for the light-absorbing layer 103a, the remaining light-absorbing layer 103aa may be left.

[Separation of Support Substrate 63]

Figure 16A:
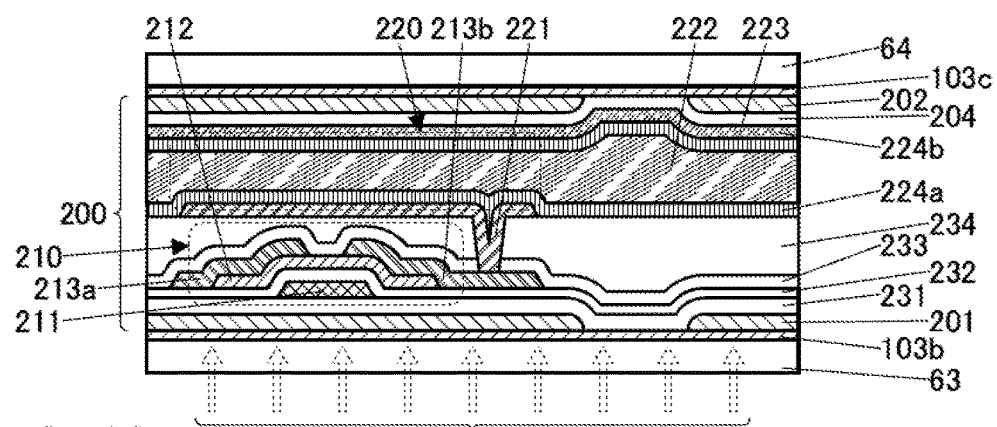
FIGS. 16A and 16B are cross-sectional views illustrating an example of a manufacturing method of a display device.

Next, as illustrated in FIG. 16A, the light-absorbing layer 103b is irradiated with the light 70 through the support substrate 63 from the support substrate 63 side of the display panel 200.

The above description can be referred to for the irradiation method of the light 70.

Figure 16B:
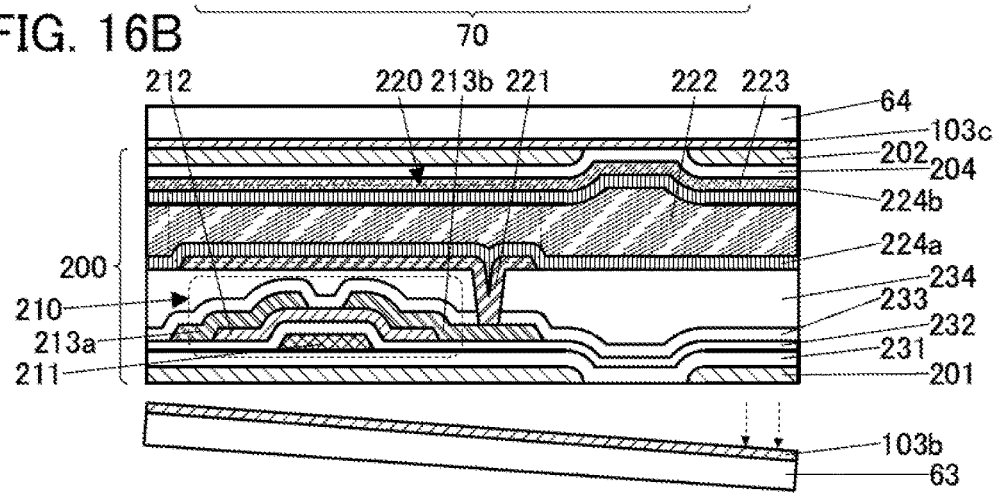

Next, the support substrate 63 and the resin layer 201 are separated (FIG. 16B). The above description can be referred to for the separation. FIG. 16B illustrates an example in which separation occurs at the interface between the light-absorbing layer 103b and the resin layer 201 and the interface between the light-absorbing layer 103b and the insulating layer 231.

[Bonding of Display Panel 100 and Display Panel 200]

Figure 17A:
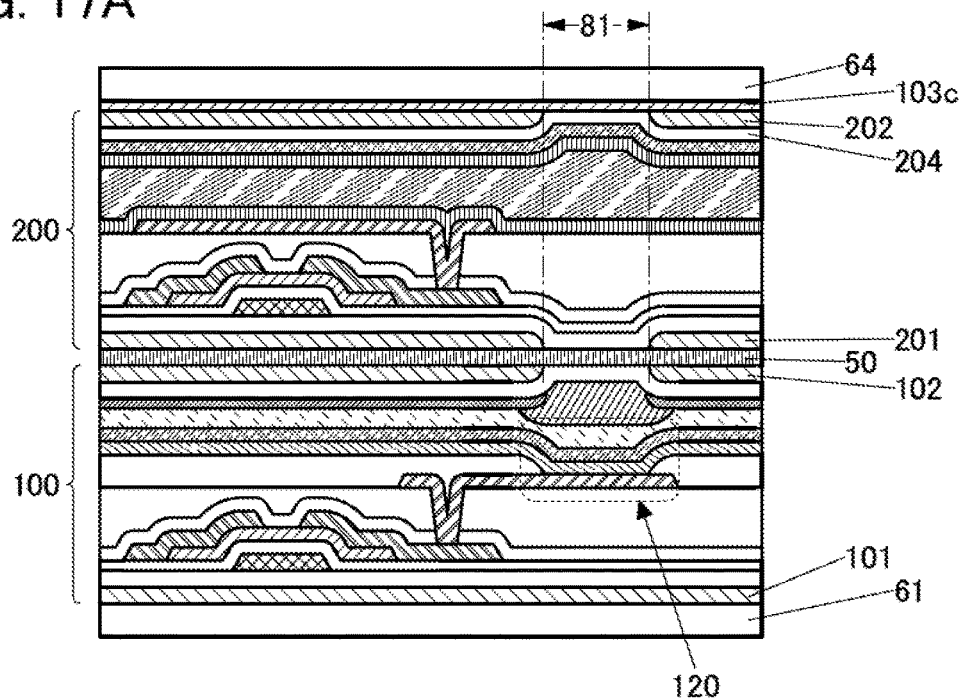
FIGS. 17A and 17B are cross-sectional views illustrating an example of a manufacturing method of a display device.

Next, as illustrated in FIG. 17A, the resin layer 102 of the display panel 100 and the resin layer 201 of the display panel 200 are bonded to each other with the adhesive layer 50. The description of the adhesive layer 151 can be referred to for the adhesive layer 50.

It is important to bond the display panel 100 and the display panel 200 such that the opening of the resin layer 102, the opening of the resin layer 201, the opening of the resin layer 202, and the light-emitting element 120 overlap with one another.

At this time, when displacement of the display panel 100 and the display panel 200 occurs, light from the light-emitting element 120 is blocked by a light-blocking member of the display panel 200 in some cases. Moreover, the resin layer 201 or the resin layer 202 is in some cases located over a path of the light from the light-emitting element 120. Therefore, it is preferable to provide an alignment marker for each of the display panel 100 and the display panel 200. According to this manufacturing method example, since the display device includes the support substrate 61 and the support substrate 64 in the bonding step, the alignment accuracy can be improved as compared with the case where flexible display panels are bonded to each other; thus, the display device can have high resolution. For example, a display device having resolution exceeding 500 ppi can be achieved.

[Separation of Support Substrate 61]

Next, the resin layer 101 is irradiated with light through the support substrate 61 from the support substrate 61 side. The description of the light 70 can be referred to for the irradiation method of the light. By the irradiation with the light, the vicinity of the surface of the resin layer 101 on the support substrate 61 side or part of the inside of the resin layer 101 is improved and the adhesion between the support substrate 61 and the resin layer 101 is reduced.

Figure 17B:
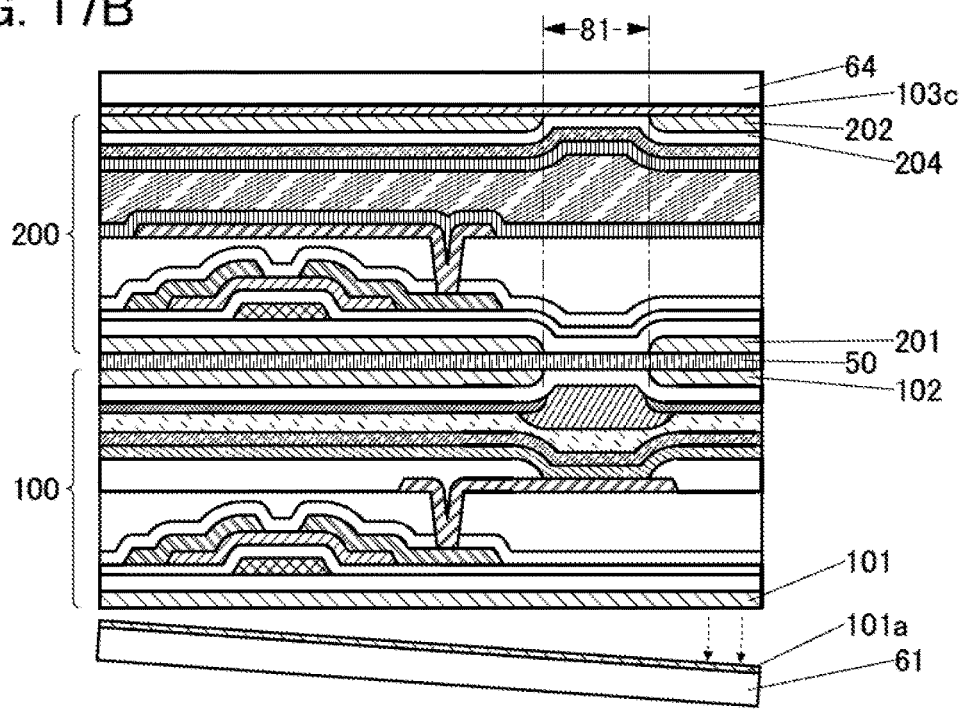

After that, as illustrated in FIG. 17B, the support substrate 61 and the resin layer 101 are separated.

FIG. 17B illustrates an example in which a resin layer 101a which is part of the resin layer 101 remains on the support substrate 61 side. Depending on the condition of the irradiation with the light, separation (fracture) occurs inside the resin layer 101 and the resin layer 101a remains in this manner in some cases. Also in the case where part of the surface of the resin layer 101 is melted, part of the resin layer 101a sometimes remains on the support substrate 61 side in a similar manner. In the case where separation is performed at the interface between the support substrate 61 and the resin layer 101, the resin layer 101a sometimes does not remain on the support substrate 61 side.

The thickness of the resin layer 101a remaining on the support substrate 61 side can be less than or equal to 100 nm, specifically approximately greater than or equal to 40 nm and less than or equal to 70 nm. The support substrate 61 can be reused by removing the remaining resin layer 101a. For example, in the case where glass is used for the support substrate 61 and a polyimide resin is used for the resin layer 101, the resin layer 101a can be removed with fuming nitric acid or the like.

The separation can be performed in a state where the support substrate 64 is fixed to a stage or the like. The above description can be referred to for the separation method.

[Bonding of Substrate 611]

Figure 18A:
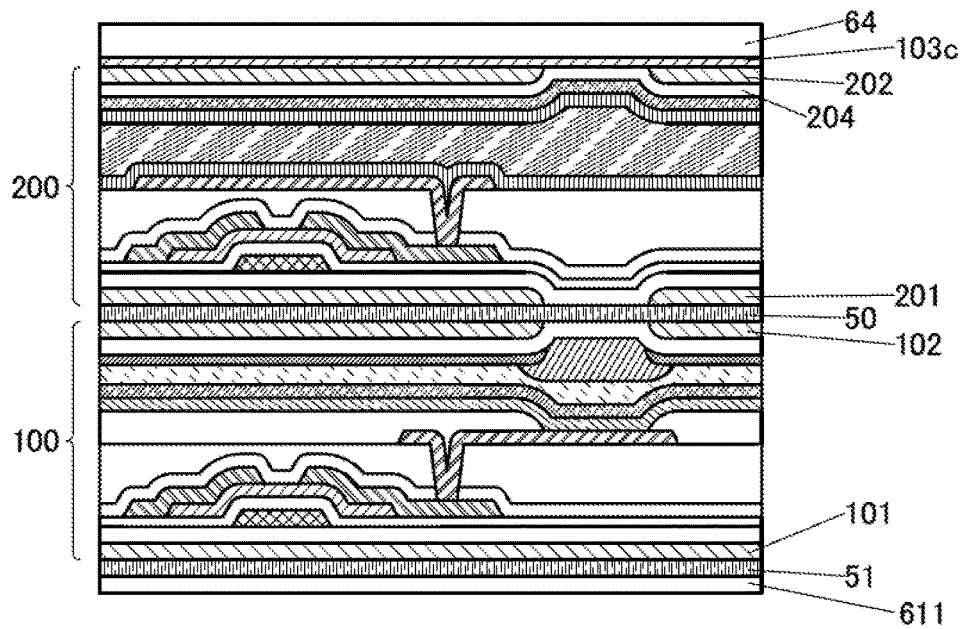
FIGS. 18A and 18B are cross-sectional views illustrating an example of a manufacturing method of a display device.

Next, as illustrated in FIG. 18A, the resin layer 101 and the substrate 611 are bonded to each other with the adhesive layer 51.

The description of the adhesive layer 151 can be referred to for the adhesive layer 51.

When a resin material is used for the substrate 611 and the substrate 612 to be described later, the display device can be reduced in weight as compared with the case where glass or the like is used for the substrate 611 and the substrate 612 with the same thicknesses. A material which is thin enough to have flexibility is preferably used because the display device can be further reduced in weight. Furthermore, when a resin material is used, the display device can have higher impact resistance; thus, a non-breakable display device can be achieved.

Since the substrate 611 is located on the side opposite to the viewing side, the substrate 611 does not necessarily transmit visible light. Therefore, a metal material can also be used. A metal material, which has high thermal conductivity, can suppress a local temperature rise in the display device because it can easily conduct heat to the whole substrate.

[Separation of Support Substrate 64]

Figure 18B:
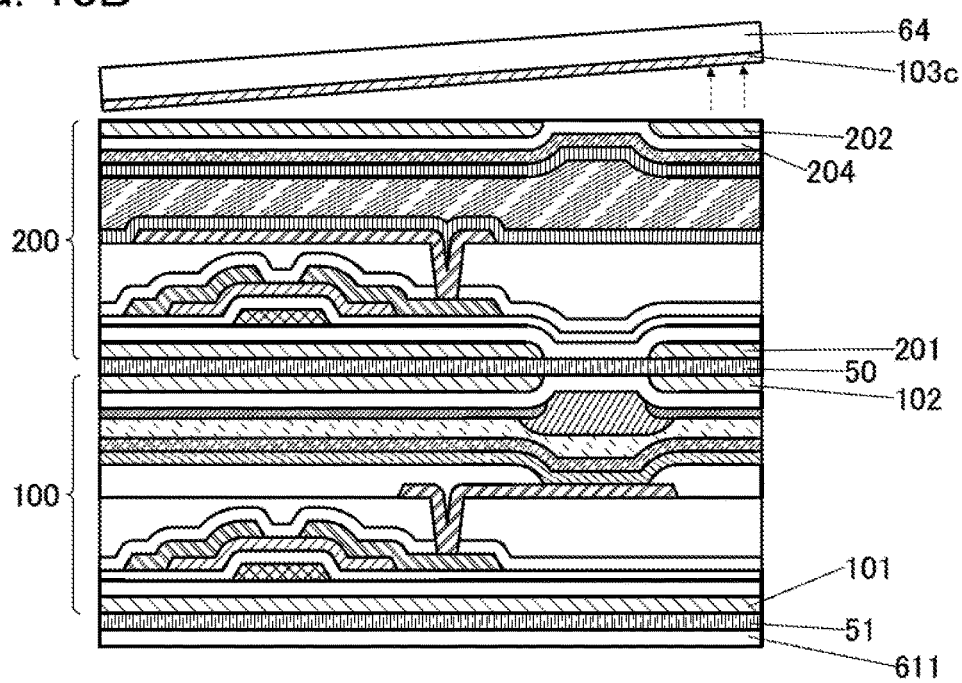

Next, the light-absorbing layer 103c is irradiated with light through the support substrate 64 from the support substrate 64 side. After that, as illustrated in FIG. 18B, the support substrate 64 and the resin layer 202 are separated. FIG. 18B illustrates an example in which separation occurs at the interface between the light-absorbing layer 103c and the resin layer 202 and the interface between the light-absorbing layer 103c and the insulating layer 204.

The irradiation method of the light 70 can be referred to for the irradiation method of the light.

The separation can be performed in a state where the substrate 611 is fixed to a stage or the like. The above description can be referred to for the separation method.

[Bonding of Substrate 612]

Next, the resin layer 202 and the substrate 612 are bonded to each other with the adhesive layer 52.

The description of the adhesive layer 151 can be referred to for the adhesive layer 52.

Since the substrate 612 is located on the viewing side, a material transmitting visible light can be used.

Through the above steps, the display 24 can be manufactured.

Modification Examples of Manufacturing Method

Methods of forming a resin layer having an opening without using a light-absorbing layer will be described below.

Note that although description is made here giving the resin layer 102 of the display panel 100 as an example, a similar method can be used also for the resin layer 201 and the resin layer 202 of the display panel 200.

Modification Example 1

Figure 19A:
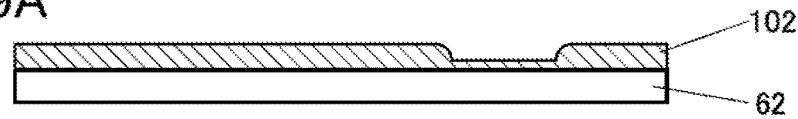
FIGS. 19A to 19E are cross-sectional views illustrating an example of a manufacturing method of a display device.

First, as illustrated in FIG. 19A, the resin layer 102 having a depressed portion is formed.

First, a material to be the resin layer 102 is applied on the support substrate 62, and pre-baking is performed. Subsequently, light exposure is performed using a photomask. At this time, the depressed portion can be formed in the resin layer 102 by setting the amount of light exposure smaller than the amount of light exposure for forming an opening in the resin layer 102. For example, as a method for reducing the amount of light exposure, light exposure may be performed for a short period of time, intensity of the exposure light may be reduced, a focus of the exposure light may be changed, or the resin layer 102 may be formed thick, as compared with the light exposure conditions for forming an opening in the resin layer 102.

In order to form both the opening and the depressed portion in the resin layer 102, an exposure technique using a half-tone mask or a gray-tone mask or a multiple exposure technique using two or more photomasks may be used.

After being subjected to the light exposure in this manner, the resin layer 102 having the depressed portion can be formed by being subjected to development treatment. After that, post-baking is performed.

Figure 19B:
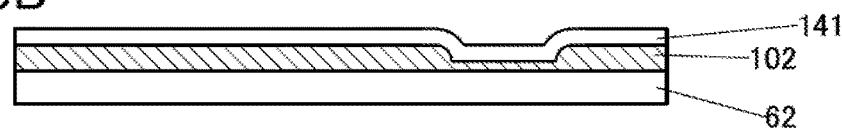

Next, as illustrated in FIG. 19B, the insulating layer 141 is formed to cover the top surface and the depressed portion of the resin layer 102.

Figure 19C:
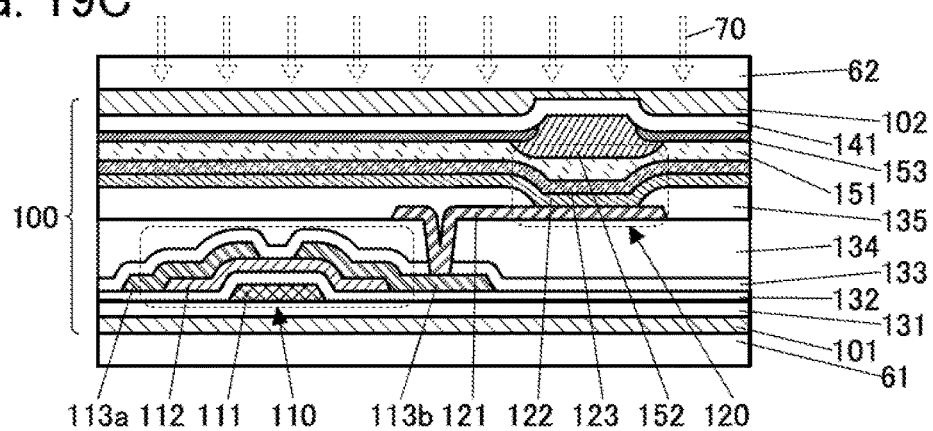

FIG. 19C is a cross-sectional view illustrating a step of performing irradiation with the light 70 after the support substrate 61 and the support substrate 62 are bonded to each other. Adhesion between the resin layer 102 and the support substrate 62 is reduced by the irradiation with the light 70.

Figure 19D:
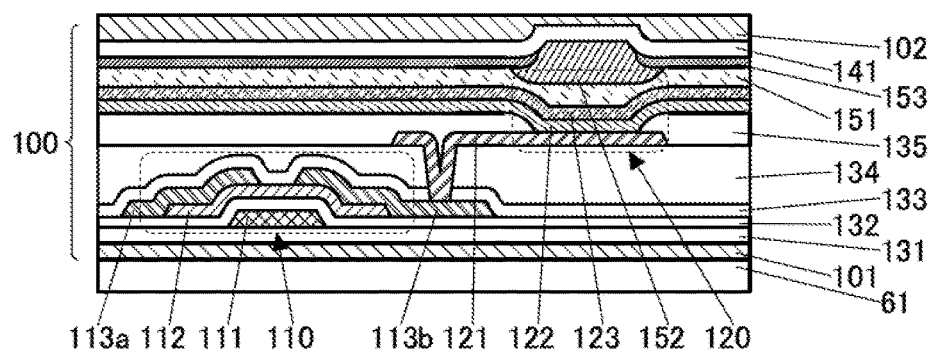

FIG. 19D is a schematic cross-sectional view in the state after peeling of the support substrate 62.

Figure 19E:
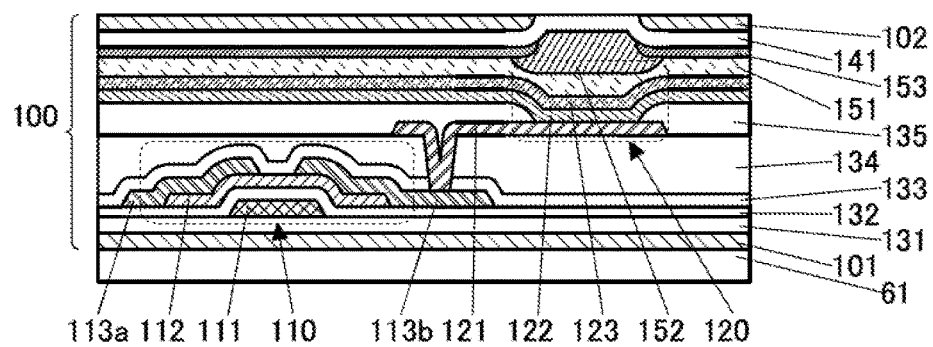

After that, as illustrated in FIG. 19E, the resin layer 102 having an opening can be formed in such a manner that part of the display side of the resin layer 102 is etched to expose the surface of the insulating layer 141. For example, plasma treatment (ashing treatment) under an atmosphere containing oxygen is preferably used for the etching, in which case controllability can be improved and etching can be performed uniformly.

Note that the resin layer 102 may be left as illustrated in FIG. 19D without being etched. Even with this structure, light absorption can be suppressed and light extraction efficiency can be increased because a portion of the resin layer 102 located in the path of light from the light-emitting element 120 is thinner than the other portion of the resin layer 102.

Modification Example 2

Figure 20A:
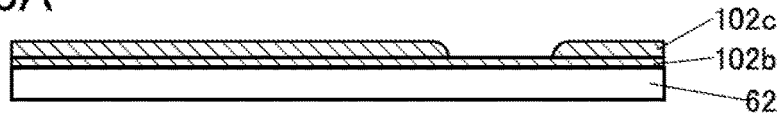
FIGS. 20A to 20D are cross-sectional views illustrating an example of a manufacturing method of a display device.

First, as illustrated in FIG. 20A, a resin layer 102b and a resin layer 102c having an opening are stacked over the support substrate 62.

The resin layer 102b can be formed in a manner similar to that of the resin layer 101. The resin layer 102c can be formed in a manner similar to that of the resin layer 102, the resin layer 201, or the like.

Here, it is preferable to sufficiently perform heat treatment on the resin layer 102b formed first and perform polymerization. Accordingly, even in the case where the same material is used for the resin layer 102b and the resin layer 102c, dissolution of the resin layer 102b in a solvent contained in a material to be the resin layer 102c formed later can be suppressed when the material is applied.

Figure 20B:
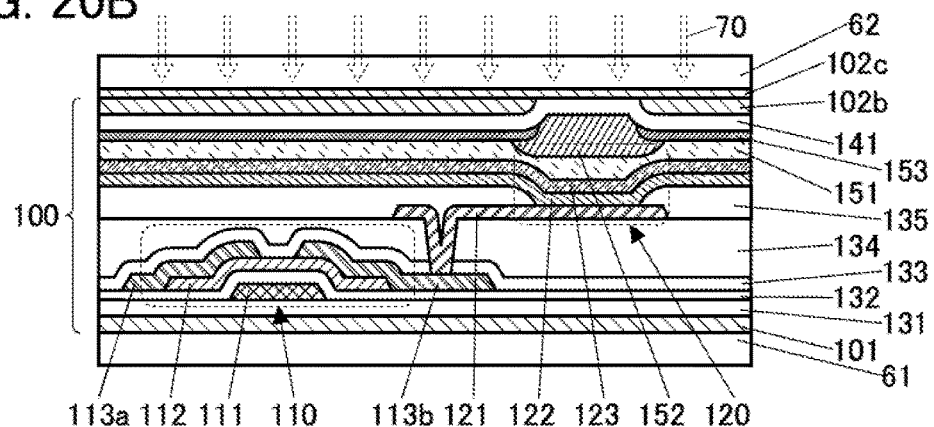

FIG. 20B is a cross-sectional view illustrating a step of performing irradiation with the light 70 after the support substrate 61 and the support substrate 62 are bonded to each other. Adhesion between the resin layer 102c and the support substrate 62 is reduced by the irradiation with the light 70.

Figure 20C:
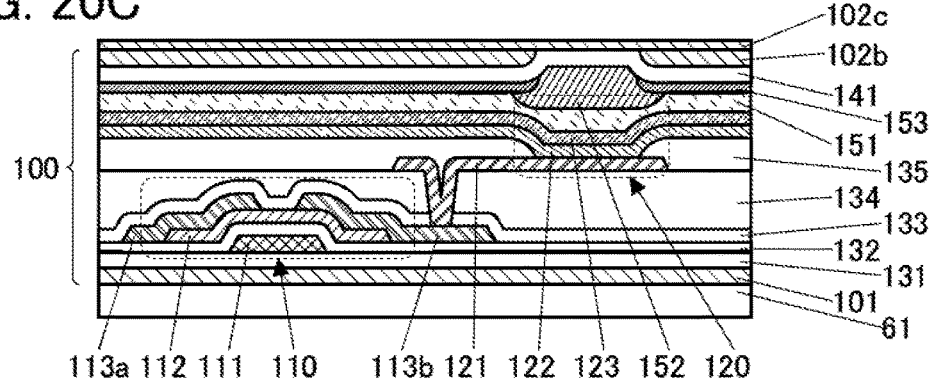

FIG. 20C is a schematic cross-sectional view in the state after peeling of the support substrate 62.

Figure 20D:
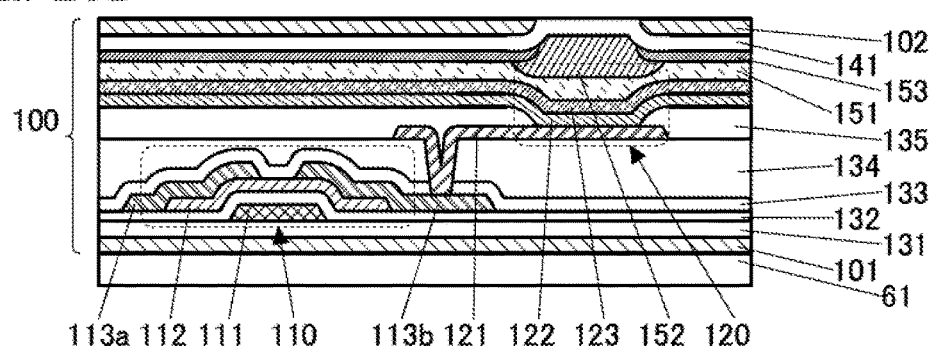

After that, as illustrated in FIG. 20D, the resin layer 102 having an opening can be formed in such a manner that the resin layer 102c is etched to expose the surface of the insulating layer 141. For example, plasma treatment (ashing treatment) under an atmosphere containing oxygen is preferably used for the etching, in which case controllability can be improved and etching can be performed uniformly.

Note that when the same material is used for the resin layer 102b and the resin layer 102c, productivity can be improved because the same material and the same manufacturing apparatus can be used. When different materials are used for these resin layers, flexibility of processing conditions can be increased because the etching selectivity ratio of the resin layer 102b with respect to the resin layer 102c or the etching selectivity ratio of the resin layer 102c to the resin layer 102b can be made high.

Note that the resin layer 102b may be left as illustrated in FIG. 20C without being etched. Even with this structure, light absorption can be suppressed and light extraction efficiency can be increased because a portion of the resin layer 102 located in the path of light from the light-emitting element 120 is thinner than the other portion.

The above is the description of the modification examples of the manufacturing method example.

Modification Example of Structure Example

A structure example that is partly different from the structure example illustrated in FIG. 11 will be described below.

In FIG. 11, the opening is provided in a portion of the resin layer that is located in the path of light from the light-emitting element 120; however, an opening may be provided also in a portion of the resin layer that is located in the path of light of the reflective liquid crystal element 220.

Figure 21:
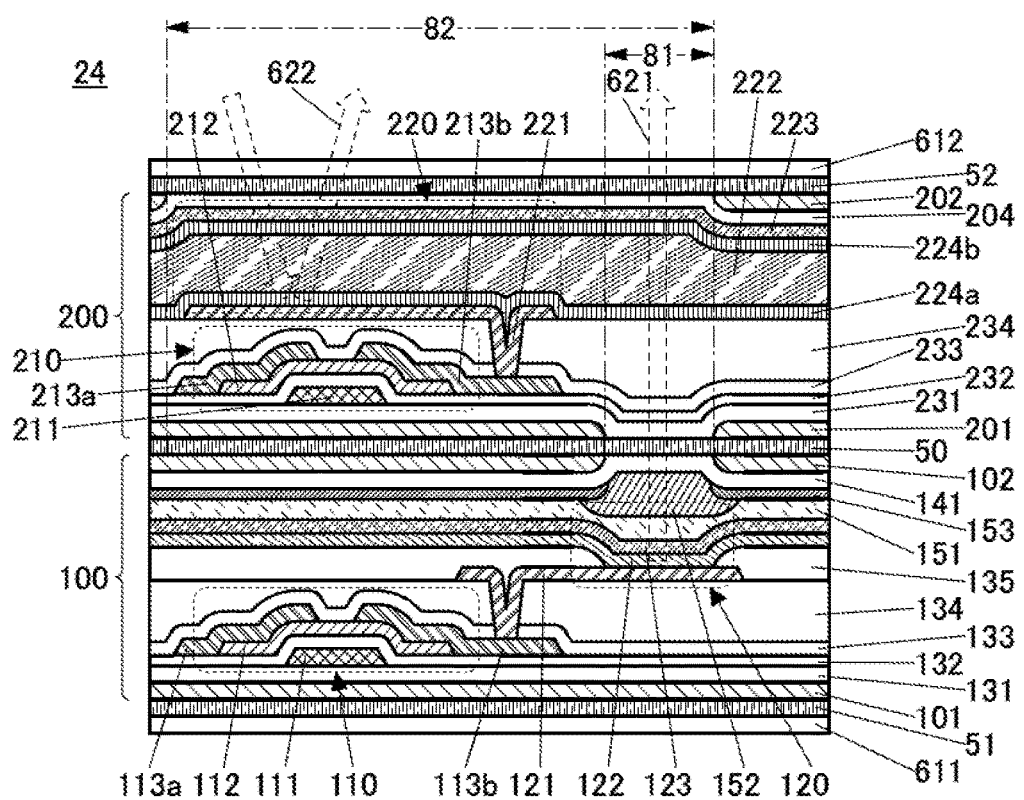
FIG. 21 is a cross-sectional view illustrating a structure example of a display device.

FIG. 21 illustrates an example in which a region 82 is included in addition to the region 81. The region 82 overlaps with the opening of the resin layer 202 and the liquid crystal element 220.

In the example illustrated in FIG. 21, the resin layer 202 is provided with one opening overlapping with the light-emitting element 120 and the liquid crystal element 220. Alternatively, an opening overlapping with the light-emitting element 120 and an opening overlapping with the liquid crystal element 220 may be separately provided.

[Transistor]

The display 24 exemplified in FIG. 11 shows an example of using bottom-gate transistors as the transistor 110 and the transistor 210.

In the transistor 110, the conductive layer 111 functioning as a gate electrode is located closer to the resin layer 101 side than the semiconductor layer 112. The insulating layer 132 covers the conductive layer 111. The semiconductor layer 112 covers the conductive layer 111. A region of the semiconductor layer 112 that overlaps with the conductive layer 111 corresponds to a channel formation region. The conductive layers 113a and 113b are provided in contact with the top surface and side end portions of the semiconductor layer 112.

Note that in the transistor 110 shown as an example, the width of the semiconductor layer 112 is wider than that of the conductive layer 111. In such a structure, the semiconductor layer 112 is located between the conductive layer 111 and each of the conductive layers 113a and 113b. Thus, the parasitic capacitance between the conductive layer 111 and each of the conductive layers 113a and 113b can be reduced.

The transistor 110 is a channel-etched transistor and can be suitably used for a high-resolution display device because the occupation area of the transistor can be reduced comparatively easily.

The transistor 210 and the transistor 110 have common characteristics.

A structure example of a transistor that can be used for the transistor 110 and the transistor 210 will be described.

Figure 22A:
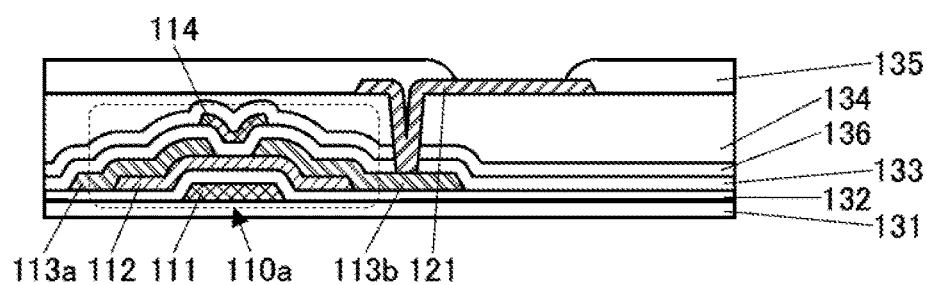
FIGS. 22A to 22C are cross-sectional views each illustrating a structure example of a display device.

A transistor 110a illustrated in FIG. 22A is different from the transistor 110 in that the transistor 110a includes a conductive layer 114 and an insulating layer 136. The conductive layer 114 is provided over the insulating layer 133 and includes a region overlapping with the semiconductor layer 112. The insulating layer 136 covers the conductive layer 114 and the insulating layer 133.

The conductive layer 114 is located to face the conductive layer 111 with the semiconductor layer 112 interposed therebetween. In the case where the conductive layer 111 is used as a first gate electrode, the conductive layer 114 can function as a second gate electrode. By supplying the same potential to the conductive layer 111 and the conductive layer 114, the on-state current of the transistor 110a can be increased. By supplying a potential for controlling the threshold voltage to one of the conductive layer 111 and the conductive layer 114 and a potential for driving to the other, the threshold voltage of the transistor 110a can be controlled.

A conductive material including an oxide is preferably used as the conductive layer 114. In that case, a conductive film to be the conductive layer 114 is formed in an atmosphere containing oxygen, whereby oxygen can be supplied to the insulating layer 133. The proportion of an oxygen gas in a film formation gas is preferably higher than or equal to 90% and lower than or equal to 100%. Oxygen supplied to the insulating layer 133 is supplied to the semiconductor layer 112 by heat treatment to be performed later, so that oxygen vacancies in the semiconductor layer 112 can be reduced.

It is particularly preferable to use, as the conductive layer 114, an oxide semiconductor whose resistance is reduced. In this case, the insulating layer 136 is preferably formed using an insulating film that releases hydrogen, for example, a silicon nitride film. Hydrogen is supplied to the conductive layer 114 during the formation of the insulating layer 136 or by heat treatment to be performed after that, whereby the electrical resistance of the conductive layer 114 can be reduced effectively.

Figure 22B:
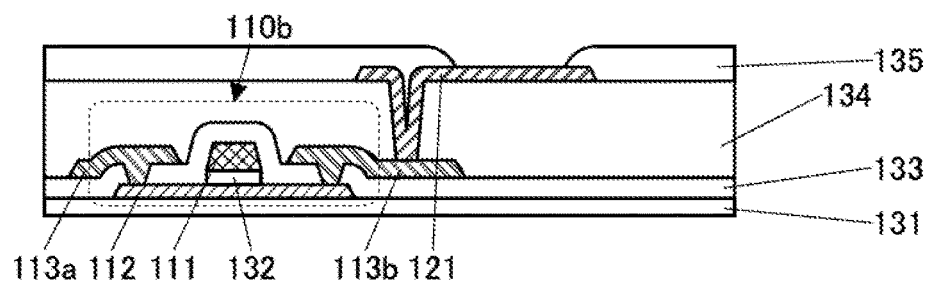

A transistor 110b illustrated in FIG. 22B is a top-gate transistor.

In the transistor 110b, the conductive layer 111 functioning as a gate electrode is provided over the semiconductor layer 112. The semiconductor layer 112 is formed over the insulating layer 131. The insulating layer 132 and the conductive layer 111 are stacked over the semiconductor layer 112. The insulating layer 133 covers the top surface and the side end portions of the semiconductor layer 112, side surfaces of the insulating layer 132, and the conductive layer 111. The conductive layers 113a and 113b are provided over the insulating layer 133. The conductive layers 113a and 113b are electrically connected to the top surface of the semiconductor layer 112 through openings provided in the insulating layer 133.

Note that although the insulating layer 132 is not present in a portion that does not overlap with the conductive layer 111 in the example, the insulating layer 132 may be provided in a portion covering the top surface and the side end portion of the semiconductor layer 112.

In the transistor 110b, the physical distance between the conductive layer 111 and the conductive layer 113a or 113b can be easily increased, so that the parasitic capacitance therebetween can be reduced.

Figure 22C:
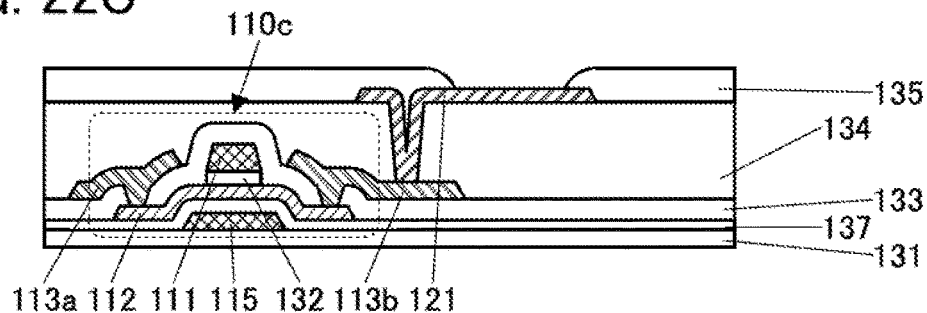

A transistor 110c illustrated in FIG. 22C is different from the transistor 110b in that the transistor 110c includes a conductive layer 115 and an insulating layer 137. The conductive layer 115 is provided over the insulating layer 131 and includes a region overlapping with the semiconductor layer 112. The insulating layer 137 covers the conductive layer 115 and the insulating layer 131.

The conductive layer 115 functions as a second gate electrode like the conductive layer 114. Thus, the on-state current can be increased and the threshold voltage can be controlled, for example.

In the display 24, the transistor included in the display panel 100 and the transistor included in the display panel 200 may be different from each other. For example, the transistor 110a or the transistor 110c can be used as the transistor that is electrically connected to the light-emitting element 120 because a comparatively large amount of current needs to be fed to the transistor, and the transistor 110 can be used as the other transistor to reduce the occupation area of the transistor.

Figure 23:
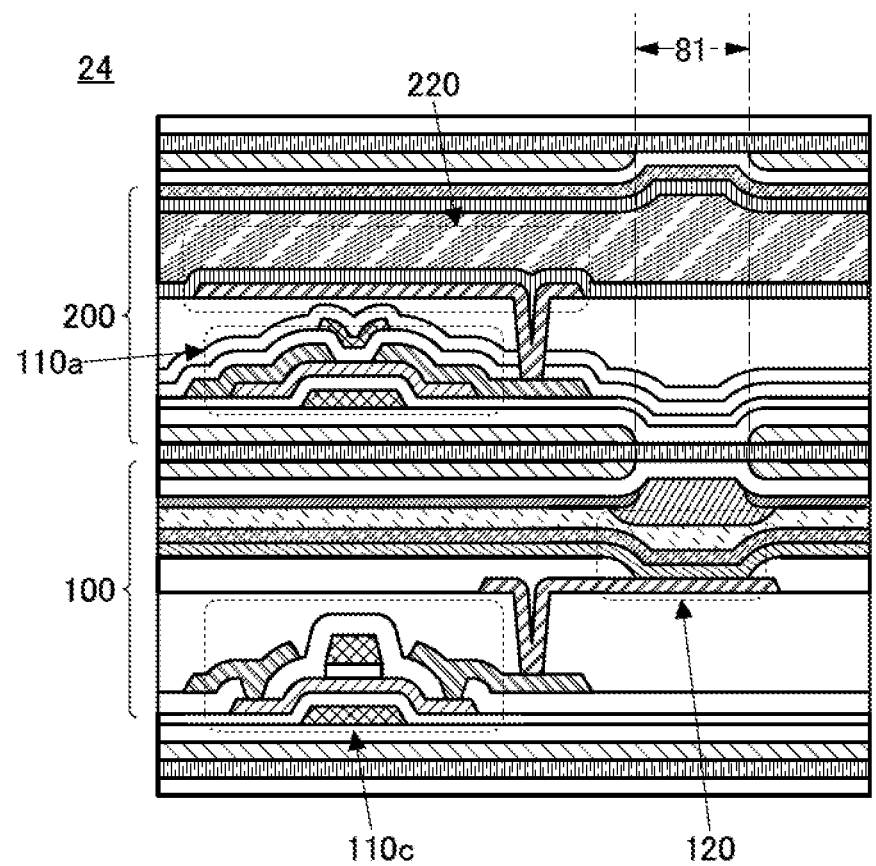
FIG. 23 is a cross-sectional view illustrating a structure example of a display device.

FIG. 23 illustrates an example of the case where the transistor 110a is used instead of the transistor 210 in FIG. 11 and the transistor 110c is used instead of the transistor 110.

The above is the description of the transistor.

At least part of this embodiment can be implemented in appropriate combination with any of the other embodiments described in this specification.

Embodiment 6

In this embodiment, portable electronic devices to which the semiconductor device of one embodiment of the present invention can be applied will be described.

Figure 24A:
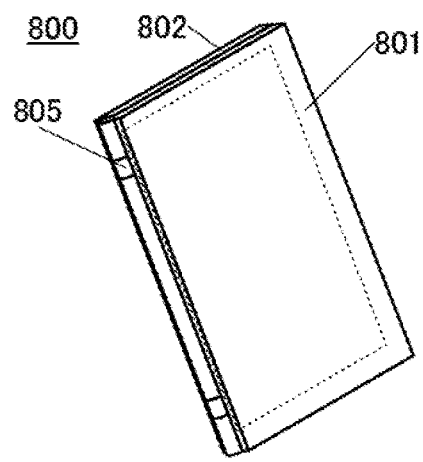
FIGS. 24A to 24D each illustrate a structure example of an electronic device.
Figure 24B:
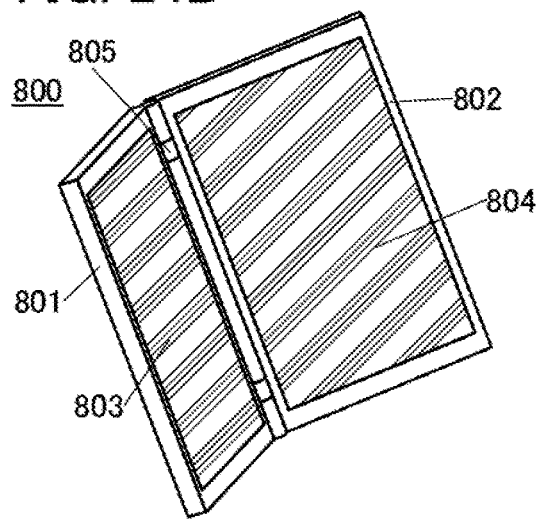

FIGS. 24A and 24B illustrate an example of a portable information terminal 800. The portable information terminal 800 includes a housing 801, a housing 802, a display portion 803, a display portion 804, a hinge 805, and the like.

The housing 801 and the housing 802 are joined together with the hinge 805. The portable information terminal 800 can be changed from a folded state illustrated in FIG. 24A to an opened state illustrated in FIG. 24B.

For example, text information can be displayed on the display portion 803 and the display portion 804; thus, the portable information terminal 800 can be used as an e-book reader. Furthermore, still images and moving images can be displayed on the display portion 803 and the display portion 804.

The portable information terminal 800 can be folded when being carried, and thus has general versatility.

Note that the housing 801 and the housing 802 may have a power button, an operation button, an external connection port, a speaker, a microphone, and the like.

Figure 24C:
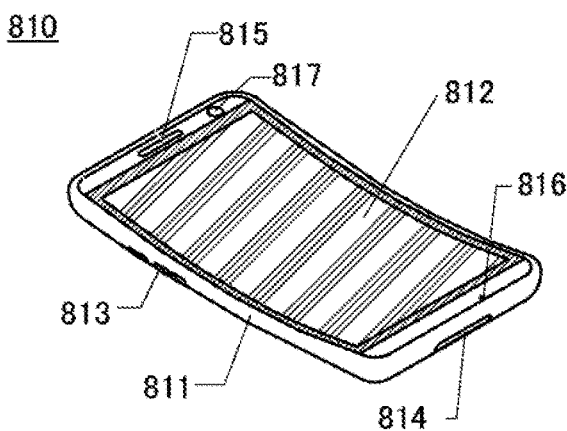

FIG. 24C illustrates an example of a portable information terminal. A portable information terminal 810 illustrated in FIG. 24C includes a housing 811, a display portion 812, operation buttons 813, an external connection port 814, a speaker 815, a microphone 816, a camera 817, and the like.

The portable information terminal 810 includes a touch sensor in the display portion 812. Operations such as making a call and inputting a letter can be performed by touch on the display portion 812 with a finger, a stylus, or the like.

With the operation buttons 813, power on/off can be switched and types of images displayed on the display portion 812 can be switched. For example, images can be switched from a mail creation screen to a main menu screen.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). The direction of display on the screen can also be changed by touch on the display portion 812, operation with the operation buttons 813, sound input using the microphone 816, or the like.

The portable information terminal 810 has one or more of a telephone function, a notebook function, an information browsing function, and the like. Specifically, the portable information terminal 810 can be used as a smartphone. The portable information terminal 810 is capable of executing a variety of applications such as mobile phone calls, e-mailing, viewing and editing texts, music reproduction, video replay, Internet communication, and games.

Figure 24D:
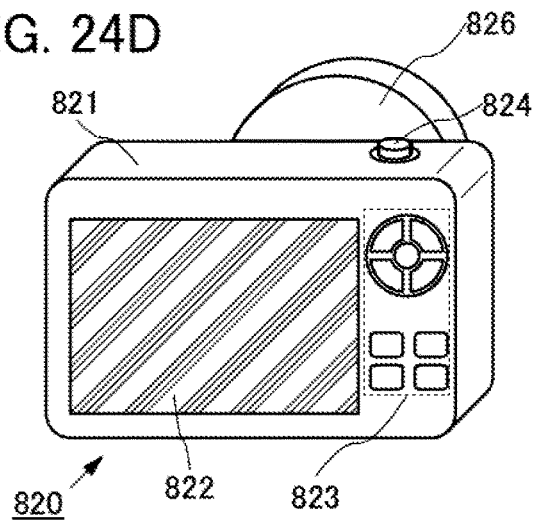

FIG. 24D illustrates an example of a camera. A camera 820 includes a housing 821, a display portion 822, operation buttons 823, a shutter button 824, and the like. The camera 820 is provided with an attachable lens 826.

Although the lens 826 of the camera 820 here is detachable from the housing 821 for replacement, the lens 826 may be integrated with the housing 821.

Still images or moving images can be taken with the camera 820 by pushing the shutter button 824. In addition, the display portion 822 functions as a touch panel, and images can be taken when the display portion 822 is touched.

Note that a stroboscope, a viewfinder, or the like can be additionally provided in the camera 820. Alternatively, these can be incorporated in the housing 821.

In the case of using a semiconductor device of the present invention for the portable electronic device of this embodiment, the use of the present invention easily makes the portable electronic device adaptive to a change in an environment even when the probability of occurrence of a soft error due to radiation becomes high owing to the usage environment.

At least part of this embodiment can be implemented in combination with any of the other embodiments described in this specification as appropriate.

This application is based on Japanese Patent Application Serial No. 2016-181182 filed with Japan Patent Office on Sep. 16, 2016, the entire contents of which are hereby incorporated by reference.

What is claimed is:

1. A semiconductor device comprising:
a first memory;
a second memory;
a processor; and
a selector,
wherein the selector is configured to transmit data from the processor to one of the first memory and the second memory, and from the one of the first memory and the second memory to the processor,
wherein in a first mode, when a predetermined number or more of soft errors are detected in the first memory, the selector is configured to transmit data from the processor to the second memory and from the second memory to the processor, and
wherein in a second mode, when no soft errors are detected in the first memory, the selector is configured to transmit data from the processor to the first memory and from the first memory to the processor.

2. The semiconductor device according to claim 1, wherein a technology node of the first memory is smaller than a technology node of the second memory.

3. The semiconductor device according to claim 1, wherein dummy data is transmitted to the first memory in the first mode, and
wherein the second mode in which starts when no soft errors are detected in the first memory in a predetermined period in the first mode.

4. The semiconductor device according to claim 1,
wherein the first memory is a memory comprising a silicon semiconductor, and
wherein the second memory is a memory comprising a transistor comprising an oxide semiconductor or a spin-transfer-torque magnetoresistive random access memory.

5. The semiconductor device according to claim 1, further comprising:
a circuit configured to generate check data by an error detection technique using first data transmitted from the processor to the first memory and stored in the first memory; and
a circuit configured to receive the first data stored in the first memory and the check data and detect an error by performing an arithmetic processing.

6. The semiconductor device according to claim 1,
wherein probability of occurrence of a soft error of the first memory is higher than probability of occurrence of a soft error of the second memory.

7. An electronic device comprising:
a display device;
a first memory;
a second memory;
a processor; and
a selector,
wherein the selector is configured to transmit data from the processor to one of the first memory and the second memory, and from the one of the first memory and the second memory to the processor,
wherein the display device comprises a reflective display element and a light-emitting display element,
wherein in a first mode, when a predetermined number or more of soft errors are detected in the first memory, the selector is configured to transmit data from the processor to the second memory and from the second memory to the processor, and
wherein in a second mode, when no soft errors are detected in the first memory, the selector is configured to transmit data from the processor to the first memory and from the first memory to the processor.

8. The electronic device according to claim 7,
wherein the reflective display element comprises a liquid crystal display element.

9. The electronic device according to claim 7,
wherein the light-emitting display element comprises an organic EL display element.

10. The electronic device according to claim 7,
wherein a technology node of the first memory is smaller than a technology node of the second memory.

11. The electronic device according to claim 7,
wherein dummy data is transmitted to the first memory in the first mode, and
wherein the second mode starts when no soft errors are detected in the first memory in a predetermined period in the first mode.

12. The electronic device according to claim 7,
wherein the first memory is a memory comprising a silicon semiconductor, and
wherein the second memory is a memory comprising a transistor comprising an oxide semiconductor or a spin-transfer-torque magnetoresistive random access memory.

13. The electronic device according to claim 7, further comprising:
   a circuit configured to generate check data by an error detection technique using first data transmitted from the processor to the first memory and stored in the first memory; and
   a circuit configured to receive the first data stored in the first memory and the check data and detect an error by performing an arithmetic processing.

14. The electronic device according to claim 7,
   wherein probability of occurrence of a soft error of the first memory is higher than probability of occurrence of a soft error of the second memory.

* * * * *